United States Patent
Endo

(10) Patent No.: US 8,105,751 B2
(45) Date of Patent: Jan. 31, 2012

(54) PLANOGRAPHIC PRINTING PLATE PRECURSOR AND PILE OF PLANOGRAPHIC PRINTING PLATE PRECURSORS

(75) Inventor: Akihiro Endo, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/759,965

(22) Filed: Jun. 8, 2007

(65) Prior Publication Data

US 2007/0287095 A1   Dec. 13, 2007

(30) Foreign Application Priority Data

Jun. 9, 2006   (JP) .................. 2006-161397

(51) Int. Cl.
 *G03F 7/09* (2006.01)
 *G03F 7/11* (2006.01)
 *G03F 7/028* (2006.01)

(52) U.S. Cl. ............... 430/273.1; 430/270.1; 430/281.1; 430/302

(58) Field of Classification Search ............... 430/270.1, 430/302, 271.1, 273.1, 281.1, 300
See application file for complete search history.

(56) References Cited

U.S. PATENT DOCUMENTS

| 4,072,527 | A | 2/1978 | Fan | |
|---|---|---|---|---|
| 6,180,213 | B1 * | 1/2001 | Kuroki et al. | 428/195.1 |
| 6,294,298 | B1 | 9/2001 | Denzinger et al. | |
| 7,097,956 | B2 | 8/2006 | Miyamoto et al. | |
| 2005/0058942 | A1 * | 3/2005 | Maehashi | 430/300 |
| 2005/0247223 | A1 * | 11/2005 | Sampei | 101/460 |
| 2006/0068327 | A1 * | 3/2006 | Mori et al. | 430/281.1 |

FOREIGN PATENT DOCUMENTS

| CN | 1579804 A | 2/2005 |
|---|---|---|
| JP | 2000-250203 A | 9/2000 |
| JP | 2006-516758 A | 7/2006 |

* cited by examiner

*Primary Examiner* — Anca Eoff

(74) *Attorney, Agent, or Firm* — Sughrue Mion, PLLC

(57) ABSTRACT

The invention has a support, a recording layer provided on the support, and a protective layer containing a hydrophilic polymer and silica-coated organic resin fine particles provided as the uppermost layer. The organic resin fine particles are preferably composed of at least one resin selected from the group consisting of polyacrylic acid resins, polyurethane resins, polystyrene resins, polyester resins, epoxy resins, phenolic resins, and melamine resins, and the protective layer preferably contains a mica compound.

10 Claims, No Drawings

PLANOGRAPHIC PRINTING PLATE PRECURSOR AND PILE OF PLANOGRAPHIC PRINTING PLATE PRECURSORS

CROSS-REFERENCE TO RELATED APPLICATION

This application claims priority under 35 U.S.C. 119 from Japanese Patent Application No. 2006-161397, the disclosure of which is incorporated by reference herein.

BACKGROUND OF THE INVENTION

1. Field of the Invention

The invention relates to a negative-type planographic printing plate precursor capable of direct writing by infrared laser beam and high speed plate-making, and a pile made by directly piling the planographic printing plate precursors without interposing laminated paper.

2. Description of the Related Art

PS plate precursors having an oleophilic photosensitive resin layer formed on a hydrophilic support have been widely used as planographic printing plate precursors. PS plates have been produced commonly by subjecting the recording layer to mask exposure (surface exposure) through a lith film and by dissolving and thus removing the non-image regions thereof.

In recent years, digital technology, by which image information is processed, stored, and outputted electronically by computer, is becoming increasingly popular. Accordingly, various newer image-output methods compatible with digital technology have been commercialized. As a result, there is an urgent need for a "computer to plate (CTP) technology" that allows direct production of printing plates by scanning a high-directivity light such as a laser beam according to digitalized image information without using a lith film, and thus there is also a need for planographic printing plate precursors that are compatible with the CTP technology.

As a planographic printing plate precursor compatible with such scanning exposure, a planographic printing plate precursor in which an oleophilic photosensitive resin layer (hereinafter, referred to as a recording layer) containing a photosensitive compound that can generate an active species such as a radical or Bronsted acid by laser exposure is formed on a hydrophilic support has been proposed and already commercialized. It is possible to obtain negative-type planographic printing plates by scanning the planographic printing plate precursor with a laser according to digital information, generating an active species and thus causing physical and chemical changes in the recording layer, insolubilizing the exposed regions, and developing the images thereon.

In particular, a planographic printing plate precursor in which a photopolymerizable recording layer containing a photopolymerization initiator superior in sensitization speed, an addition-polymerizable ethylenic unsaturated compound, and a binder polymer soluble in alkaline developing solution, and additionally an oxygen-blocking protective layer as needed, are formed on a hydrophilic support (see, for example, Japanese Patent Application Laid-Open (JP-A) No. 10-228109), is superior in productivity, easier in developing processing, and superior in resolution and inking property and is therefore a desirable printing plate precursor with superior printing properties.

For further improvement in productivity, i.e., in plate-making speed, a recording material that employs a photopolymerizable composition containing a cyanine dye having a particular structure, an iodonium salt and an addition-polymerizable compound having an ethylenic unsaturated double bond as the recording layer and that does not require heat treatment after image exposure has been proposed (see, for example, Japanese Patent Application Publication (JP-B) No. 7-103171), but the recording material is susceptible to polymerization inhibition by oxygen in the air during the polymerization reaction and thus has problems that the sensitivity is lower and the strength of image portions formed in the image region is insufficient.

To address these problems, a method of forming a protective layer containing a water-soluble polymer on a recording layer and a method of forming a protective layer containing an inorganic layered compound and a water-soluble polymer are known (see, for example, JP-A No. 11-38633). Presence of the protective layer enables prevention of polymerization inhibition, acceleration of the curing reaction of the recording layer, and improvement in the strength of the image region.

On the other hand, reduction of the time needed in an exposure step is important for improving productivity in plate-making of a photopolymerizable planographic printing plate precursor that can be easily developed. Usually, the planographic printing plate precursors are supplied in the exposure step as a pile containing, between the precursors, a laminated paper for preventing adhesion of the plate precursors and scratching due to abrasion between the surfaces of the relatively soft protective layers and the aluminum supports. As a result, the time needed for removing the laminated paper results in inefficiency in the exposure step. To improve efficiency in the exposure step, it is desirable to eliminate the step of removing the laminated paper by using a pile containing no laminated paper between the precursors, and thus, there is a need for a method of improving the adhesion resistance of the planographic printing plate precursors and preventing scratching due to abrasion between a protective layer surface and an aluminum support.

To improve the adhesion resistance of the planographic printing plate precursors, it is effective to provide a protective layer containing the above-described inorganic layered compound and water-soluble polymer; however at present the layer still needs to have higher scratch resistance.

For the reasons above, there is a need for a planographic printing plate precursor which effectively suppresses polymerization inhibition in the recording layer, and even in a pile containing no laminated paper between the precursors, provides improved adhesion resistance between the precursors, suppresses scratches caused by rubbing between the surfaces of the protective layers and the aluminum supports of the precursors, and thereby improves the productivity of the plate-making operation.

Accordingly, there is a need for a planographic printing plate precursor that is writable by laser exposure, and composed of a recording layer having thereon a protective layer, and that can improve the productivity of the plate-making operation.

More specifically, there is a need for a planographic printing plate precursor composed of a recording layer that is writable by laser exposure, and a protective layer provided on the recording layer, wherein the protective layer suppresses polymerization inhibition in the recording layer, provides excellent development removability, suppresses adhesion between the front surface of a protective layer and an adjacent support side surface of piled planographic printing plate precursors, and reduces scratchubg between the front surface of the protective layer and the rear surface of the aluminum support.

There is a further need for a pile of planographic printing plate precursors without interposing laminated paper that prevents adhesion between a protective layer and an adjacent rear surface of a support, and reduces scratches on the protective layer, and thereby improves the productivity of the plate-making operation.

SUMMARY OF THE INVENTION

More specifically, a first aspect of the invention is to provide a planographic printing plate precursor composed of a support, a polymerizable negative-type recording layer provided on the support, and a protective layer as the uppermost layer, wherein the protective layer contains silica-coated fine particles of an organic resin and a hydrophilic polymer.

A second aspect of the invention is to provide a pile of planographic printing plate precursors composed of a plurality of the planographic printing plate precursors of the invention which are in direct contact with each other.

The mechanism of the invention is not evident, but is estimated as follows.

Generally, the protective layer of a planographic printing plate precursor having a polymerizable negative-type recording layer includes a hydrophilic polymer having an excellent oxygen-blocking property, such as polyvinyl alcohol. In the production of such a planographic printing plate precursor on a plant scale, if a protective layer coating liquid composed mainly of an aqueous solution of polyvinyl alcohol is mixed with a coating solution containing dispersed organic resin fine particles for the purpose of imparting a matting property, the hydrophobic organic resin fine particles tend to separate from the hydrophilic polyvinyl alcohol polymer because of low compatibility between them during storage for several hours to about one day before the initiation of application. Accordingly, if a protective layer is provided on a recording layer using the coating liquid, the organic resin fine particles are unevenly distributed, thereby portions having no resin particle or portions having aggregates of the resin particles may occur in the protective layer.

In the invention, silica-coated fine particles of an organic resin having excellent compatibility with a hydrophilic resin such as polyvinyl alcohol are added to the hydrophilic polymer as the main component of a protective layer, which improves the dispersion stability of the organic resin fine particles and addresses the above-described problem caused by separation of the organic resin fine particles from the coating liquid.

More specifically, since the organic resin fine particles coated by a silica component have excellent compatibility with the hydrophilic polymer of the coating film, the following has been found. The particles are evenly dispersed, and adhesiveness thereof to the hydrophilic polymer at the particle interfaces is improved to improve the coating properties after application and drying. The organic resin fine particles scarcely drop off even upon contact with outside, and the protective layer exhibits stable scratch resistance.

Further, since the silica component used for coating the fine particles has an excellent oxygen-blocking property, typically, they will not cause deterioration in the oxygen-blocking property, which is caused by organic resin fine particles added as a matting agent. Therefore, even if the organic resin particles coated with silica component is added to the overcoat layer having an oxygen-blocking function provided on a polymerizable negative-type recording layer, good oxygen-blocking property of the layer are maintained without occurrence of pinholes in the shape of fine particles (inhibition of image formation in the exposed portion). Accordingly, a good balance is kept between the excellent scratch resistance and oxygen-blocking property.

DETAILED DESCRIPTION

The invention is further described below.

In the first place, the planographic printing plate precursor of the invention is described.

<Planographic Printing Plate Precursor>

The planographic printing plate precursor of the invention has a support, preferably an aluminum support having a hydrophilic surface, a polymerizable negative-type recording layer containing at least one infrared absorbent, at least one polymerization initiator, at least one polymerizable compound, and optionally at least one binder polymer, and a protective layer in that order, wherein the protective layer contains silica-coated fine particles of an organic resin and a hydrophilic polymer, and the protective layer is provided as the uppermost layer of the planographic printing plate precursor.

These constituents of the planographic printing plate precursor of the invention are further described below.

<Protective Layer as Uppermost Layer>

The protective layer provided as the top of the planographic printing plate precursor according to the invention (hereinafter, referred to as a specific protective layer in some cases) contains silica-coated fine particles of an organic resin (hereinafter, referred to as silica-coated fine particles in some cases) and a hydrophilic polymer.

The recording layer in the planographic printing plate precursor of the invention is, as will be further described later, a polymerizable negative-type recording layer that is usually exposed to light in the air, hence a protective layer is provided on the recording layer for the purpose of preventing the introduction of low molecular weight compounds in the air such as oxygen, moisture, and basic substances that inhibit image formation reaction into the recording layer.

When a hydrophilic polymer, preferably a hydrophilic polymer composed mainly of polyvinyl alcohol, and silica-coated fine particles of an organic resin are contained in the protective layer, specifically a specific protective layer disposed as the top of the precursor, the stability of the fine particles of the organic resin in a coating liquid is markedly improved. Further, a planographic printing plate precursor made using the coating liquid constantly achieves excellent film strength, and the protective layer has a matting property. As a result, the protective layer has improved sensitivity, storage stability over time, and safelight suitability, and can suppress the deterioration due to deformation and occurrence of scratches. Further, the excellent matting property of the protective layer suppresses, in a pile of the planographic printing plate precursors of the invention, the adhesion between the front surface of the protective layer of one planographic printing plate precursor and the rear surface of the support of the adjacent printing plate precursor, and the occurrence of scratches between the front surface of the protective layer and the rear surface of the aluminum support.

As described above, the specific protective layer according to the invention is capable of imparting a matting property, hence it must be present as the uppermost layer of the planographic printing plate precursor.

Further, when the specific protective layer according to the invention has a single structure, the specific protective layer preferably contains a mica compound. When the specific protective layer has a laminated structure, any of the plural layers preferably contains a mica compound. This is because various properties such as oxygen-blocking property, external pressure resistance, and adhesion resistance are improved.

The components of the protective layer according to the invention are further described in succession.

Silica-Coated Organic Resin Fine Particles

The silica-coated fine particles in the invention are prepared by coating the surface of fine particles of an organic resin with silica. The organic resin fine particles as cores are contained to suppress the adhesion between the front surface of the protective layer of one planographic printing plate precursor and the rear surface of the support of the adjacent planographic printing plate precursor, and the occurrence of scratches between the front surface of the protective layer and the rear surface of the aluminum support. The fine particles serving as a matting agent are preferably resin particles that do not substantially inhibit the transmission of rays used for exposure, and do not soften or become wet by moisture in the air or heat. When the particles are contained in the uppermost protective layer, they preferably impart adequate irregularities to the surface of the layer to decrease the adhesion surface area.

Further, from the viewpoint of suppressing scratches, the matting particles preferably relieve the stress produced upon rubbing with the hard Al surface. Further, the fine particles preferably have high affinity for the hydrophilic polymer as the binder in the protective layer, preferably polyvinyl alcohol generally used in the protective layer, well kneaded in the film, and are sufficiently miscible in the coating, and hardly fall off from the film surface even after film formation.

The organic resin of the organic resin fine particles serving as the cores of the silica-coated fine particles according to the invention may be freely selected from resins having the above-described physical properties, and examples thereof include polyacrylic resins, polyurethane resins, polystyrene resins, polyester resins, epoxy resin, phenolic resins, melamine resins, and silicone resins.

Among them, the organic resin is preferably polyacrylic resin, polyurethane resin, and/or melamine resin from the viewpoint of affinity for polyvinyl alcohol, which is a preferable binder.

Examples of the material forming the silica layer coating the surface of the organic resin fine particles include alkoxysilyl group-containing compounds such as condensates of alkoxysiloxane compounds, and particularly preferable examples include siloxane materials, and silica fine particles such as silica sol, colloidal silica, and silica nanoparticles which are used by a sol-gel method.

The silica-coated fine particles may be prepared by attaching silica fine particles as the solid component to the surfaces of the organic resin fine particles, or by forming a siloxane compound layer on the surfaces of the organic resin fine particles through condensation reaction of an alkoxysiloxane compound.

Silica is not necessarily required to coat the entire surfaces of the organic resin fine particles. The effect of the invention is achieved when the organic resin fine particles are coated with 0.5% by weight or more of silica. More specifically, when silica is present on at least a portion of the surfaces of the organic resin fine particles, the surfaces of the organic fine particles has improved affinity for PVA, thereby the desorption of the fine particles is prevented even under external stress, which allows the maintenance of excellent scratch resistance and adhesion resistance. Accordingly, the scope of "silica coating" or "silica-coated" in the invention includes a state in which silica is present on at least a portion of the surfaces of the organic resin fine particles.

The surface coating with silica can be confirmed by morphological observation using a scanning electron microscope (SEM), and the coating amount of silica may be determined by detecting Si atoms by elementary analysis such as X-ray fluorometric analysis, and calculating the abundance of silica thereon.

A method for preparing silica-coated fine particles is not particularly limited, and may be a method of forming a silica coating layer concurrently with forming organic resin fine particles in the coexistence of silica fine particles or a silica precursor compound and a monomer component as the raw material of the resin fine particles, or a method of forming organic resin fine particles, and then physically attaching silica fine particles to the surface of the organic resin fine particles, and then fixing the particles thereon.

An example of the preparation is as follows. In the first place, silica and a raw resin (more specifically, a raw resin such as a polymerizable monomer through suspension polymerization, a prepolymer crosslinkable through suspension crosslinking, or a resin solution of the above-described organic resin) are added to water containing a water-soluble polymer such as polyvinyl alcohol, methyl cellulose, or polyacrylic acid and a suspension stabilizer appropriately selected from inorganic suspending agents such as calcium phosphate and calcium carbonate, and mixed and stirred, and thus a suspension containing dispersed silica and a hydrophobic raw resin is prepared. An emulsion (suspension) having a desired particle diameter can be formed by appropriately selecting the kind and concentration of the suspension stabilizer, and the speed of agitation. Subsequently, the suspension is heated to initiate the reaction, and the raw resin is subjected to suspension polymerization or suspension crosslinking to generate resin particles. At this time, coexisting silica is fixed in the vicinity of the resin particles cured by polymerization or crosslinking reaction, particularly in the vicinity of the surface of the resin particles owing to the physical properties. Thereafter, the particles are isolated by solid-liquid separation, washed to remove the suspension stabilizer attaching to the particles, and dried. In this way, substantially spherical organic resin particles having fixed silica and a desired particle diameter are prepared.

As described above, particles having a desired particle diameter may be prepared by controlling the conditions of the suspension polymerization or suspension crosslinking. Alternatively, silica-attached fine particles may be prepared without such strict control, followed by mesh filtration to obtain silica-coated fine particles having a desired particle diameter.

In the preparation of silica-coated fine particles by the above-described method, the ingredients of the mixture are added in the following amounts. When the total amount of the raw resin and silica is 100 parts by weight, in the first place, 0.1 to 20 parts by weight of a suspension stabilizer are added to 200 to 800 parts by weight of water as a dispersion medium, and sufficiently dissolved or dispersed therein. To the solution, 100 parts by weight of the above-described mixture of the raw resin and silica are added. The resultant is stirred at a speed adjusted to achieve a predetermined diameter of the dispersed particles. After the adjustment of the particle diameter, the liquid temperature is increased to 30 to 90° C., and allowed to react for 1 to 8 hours.

The above-described method is an example of the methods for preparing the silica-coated fine particles, and other examples thereof are described in detail in, for example, Japanese Patent Application Laid-Open (JP-A) Nos. 2002-327036, 2002-173410, 2004-307837, and 2006-38246. Silica-coated fine particles prepared by the method described therein are preferably used in the invention.

Silica-coated fine particles usable in the invention are also commercially available, and specific examples of commercial products include silica/melamine composite fine particles such as OPTBEADS 2000M, OPTBEADS 3500M, OPTBEADS 6500M, OPTBEADS 10500M, OPTBEADS 3500S, and OPTBEADS 6500S manufactured by Nissan Chemical Industries, Ltd., silicalacryl composite fine particles such as ARTPEARL G-200 Transparent, ARTPEARL G-400 Transparent, ARTPEARL G-800 Transparent, ARTPEARL GR-400 Transparent, ARTPEARL GR-600 Transparent, ARTPEARL GR-800 Transparent, and ARTPEARL J-7P manufactured by Negami Chemical industrial Co., Ltd., and silica/urethane composite fine particles such as ARTPEARL C-400 Transparent, C-800transparent, P-800T, U-600T, U-800T, CF-600T, and CF800T manufactured by Negami Chemical Industrial Co., Ltd., and DYNAMIC BEADS CN5070D, and DANPLACOAT THU manufactured by Dainichiseika Color & Chemicals Mfg. Co., Ltd.

The shape of the silica-coated fine particles according to the invention is preferably spherical, however may be tabular or elliptical.

The average particle diameter is preferably 1 to 30 µm, more preferably 1.5 to 20 µm, and most preferably 2 to 15 µm. When the diameter is within the range, the particles develop sufficient spacer function and matting performance, is readily fixed on the protective layer surface, and securely remain thereon against outside contact stress.

The addition amount of the silica-coated fine particles in the specific protective layer according to the invention is preferably 5 to 1000 mg/m$^2$, more preferably 10 to 500 mg/m$^2$, and most preferably 20 to 200 mg/m$^2$.

The addition amount of the silica-coated fine particles for the entire protective layer is preferably 0.5 to 95% by weight, more preferably 1 to 50% by weight, and most preferably 2 to 20% by weight with respect to the total solid content of the protective layer.

Other Organic Resin Fine Particles

In addition to the silica-coated organic resin fine particles, the specific protective layer according to the invention may contain other organic resin fine particles having no silica coating layer within the range which does not impair the effect of the invention.

Preferable examples of other organic resin fine particles include fine particles of synthetic resins such as poly(meth)acrylic esters, polystyrene, and derivatives thereof, polyamides, polyimides, polyolefins, including low density polyethylene, high density polyethylene, and polypropylene, polyurethane, polyurea, and polyesters, and fine particles of natural polymers such as chitin, chitosan, cellulose, crosslinked starch, and crosslinked cellulose.

Among them, synthetic resin fine particles are preferable from the viewpoints of easiness of particle size control, and easiness of desired surface property control through surface modification.

The organic resin fine particles may be produced by a crushing method when the resin is a relatively hard resin such as PMMA. However, at present, the particles are usually synthesized by emulsion suspension polymerization owing to the easiness and accuracy of particle diameter control.

The method to produce the fine particle powder is described in detail in "Chobiryushi to Zairyo" edited by Materials Science Society of Japan, published by Shokabo Publishing Co., Ltd., 1993, and "Manufacturing and Application of Particles and Powders (or Biryushi Funtai no Sakusei to Oyo)", supervised by Haruma Kawaguchi, published by CMC Inc., 2005.

In the specific protective layer, the organic resin fine particles which may be used in combination with the silica-coated fine particles are also commercially available, and examples thereof include crosslinked acrylic resins manufacture by Soken Chemical & Engineering Co., Ltd. such as Mx-300, MX-500, Mx-1000, NaX-1500H, MR-2HQ MR-7HQ MR-10HQ MR-3GSN, MR-5GSN, MR-7G, MR-10G, MR-5C, and MR-7GC, styryl resins manufacture by Soken Chemical & Engineering Co., Ltd. such as SX-350H and SX-500H, acrylic resins manufactured by Sekisui Plastics Co., Ltd. such as MBX-5, MBX-8, MBX-12, MBX-15, MBX-20, MB20X-5, MB30X-5, MB30X-8, MB30X-20, SBX-6, SBX-8, SBX-12, and SBX-17, polyolefin resins manufactured by Mitsui Chemicals, Inc. such as CHEMIPEARL W100, W200, W300, W308, W310, W400, W401, W405, W410, W500, WF640, W700, W800, W900, W950, and WP100.

Other organic resin fine particles contained in the specific protective layer according to the invention as an optional component preferably has a true specific gravity of 0.90 to 1.30, an average particle diameter of 2.0 to 15 µm, and more preferably a true specific gravity of 0.90 to 1.20, and an average particle diameter of 3.0 to 12 µm.

The content of the particles with respect to the solid content of the protective layer is preferably 1.0 to 30% by mass, and more preferably 2.0 to 20% by mass. The content of the particles with respect to the silica-coated fine particles, which is an essential component, is preferably in the range of 5.0 to 50% by mass.

The use of the organic resin fine particles as an optional component improves the surface matting effect, adhesion prevention effect, and scratch resistance. However, if the addition amount of the particles exceeds the above-described preferable range, problems such as the decrease in the sensitivity or easy falling off of the organic fine particles from the protective layer surface may occur.

Water-Soluble Polymer

Since the planographic printing plate precursor of the invention has a polymerizable negative-type recording layer, it preferably has a protective layer having an excellent oxygen-blocking property.

The binder of the protective layer may be freely selected from those forming a uniform coating, and is preferably a water-soluble polymer from the viewpoint described below in detail. However, the binder is not limited thereto, and appropriately selected water-insoluble polymer(s) may be used together within a range which does not impair the effect of the invention.

Specific examples of the polymer useful as the binder of the protective layer include water-soluble polymers such as polyvinyl alcohol, modified polyvinyl alcohol, polyvinyl pyrrolidone, polyvinyl imidazole, polyacrylic acid, polyacrylamide, partially saponified polyvinyl acetate, ethylene-vinyl alcohol copolymer, water-soluble cellulose derivatives, gelatin, starch derivatives, and gum arabic, and polymers such as polyvinylidene chloride, poly(meth)acrylonitrile, polysulfone, polyvinyl chloride, polyethylene, polycarbonate, polystyrene, polyamide, and cellophane. Two or more of these polymers may be used together, as necessary.

Among them, the binder polymer used to form the protective layer is preferably a polymer having excellent adhesiveness to the recording layer, having a surface (outermost surface) with low adhesiveness to other materials, and is readily removed in the developing step after exposure.

From these viewpoints, the binder component of the protective layer is preferably a water-soluble polymer. In particular, the main component of the binder is preferably polyvinyl alcohol. Polyvinyl alcohol has an excellent film forming property and a relatively low adhesive surface.

The polyvinyl alcohol (PVA), which is used as a preferable water-soluble polymer in the invention, has preferably a saponification degree of 85 to 99, and more preferably 91.0 to 99. When the saponification degree is within the range, the polyvinyl alcohol may have any structure as long as it contains an unsubstituted vinyl alcohol unit to develop a required oxygen-blocking property and low adhesiveness of the surface. More specifically, the polyvinyl alcohol may be partially substituted by an ester, ether, or acetal, partially modified, or contain other copolymerization components.

In general, the higher the saponification degree of the PVA is, or the higher the content of the unsubstituted vinyl alcohol unit is, the higher the oxygen-blocking property is. Accordingly, the protective layer according to the invention is preferably composed mainly of, for example, polyvinyl alcohol having a saponification degree of 91 mol % or more. As will be described later, the oxygen-blocking property of the protective layer is further improved by adding a mica compound to any one of the protective layers.

The polyvinyl alcohol preferably has a degree of polymerization of 200 to 2,400. Such a polymer is commercially available, and specific examples thereof include PVA-102, PVA-103, PVA-104, PVA-105, PVA-110, PVA-117, PVA-120, PVA-124, PVA-117H, PVA-135H, PVA-HC, PVA-617, PVA-624, PVA-706, PVA-613, PVA-CS, PVA-CST (manufactured by Kuraray Co., Ltd.), GOHSENOL NL-05, NM-11, NM-14, AL-06, P-610, C-500, A-300, AH-17 (manufactured by Nippon Synthetic Chemical Industry Co., Ltd.), JF-04, JF-05, JF-10, JF-17, JF-17L, JM-05, JM-10, JM-17, JM-17L, JT-05, JT-13, and JT-15 (manufactured by Japan Vam & Poval Co., Ltd.).

Further, preferable examples of the water-soluble polymer used in the invention include carboxy-modified polyvinyl alcohols such as itaconic acid- or maleic acid-modified polyvinyl alcohol, and sulfonic acid-modified polyvinyl alcohol. These acid-modified polyvinyl alcohols can be preferably used.

Examples of the acid-modified polyvinyl alcohol which is preferably used to form the specific protective layer according to the invention include KL-118, KM-618, KM-118, SK-5102, MP-102, R-2105 manufactured by Kuraray Co., Ltd., GOHSENAL CKS-50, T-HS-1, T-215, T-350, T-330, T-330H manufactured by Nippon Synthetic Chemical Industry Co., Ltd., AF-17 and AT-17 manufactured by Japan Vam & Poval Co., Ltd.

The content of the water-soluble polymer(s) (preferably polyvinyl alcohol) is preferably in the range of 45 to 95% by mass, and more preferably in the range of 50 to 90% by mass with respect to the total solid content of the protective layer. When the content is within the range, an excellent film forming property and high sensitivity and low adhesiveness derived from the excellent film forming property are achieved, and thereby the adhesion between the piled planographic printing plate precursors is suppressed.

One type of water-soluble polymer of the protective layer may be used, or two types or more of water-soluble polymers can be used in the protective layer according to the desired use. For example, oxygen permeability is controlled through the use of a combination of PVA and polyvinyl pyrrolidone. Even when plural kinds of water-soluble polymers are used, the total content thereof is preferably in the above-described mass range.

The coating amount of polyvinyl alcohol in the protective layer and other conditions are selected in consideration of the oxygen-blocking property, development removability, fogging property, adhesiveness, and scratch resistance.

The protective layer in the invention preferably has an oxygen permeability of 0.5 ml/m$^2$·day to 100 ml/m$^2$·day under conditions of 25° C., 60% RH, and 1 atmospheric pressure. A composition which achieves the oxygen permeability is selected.

Preparation of Coating Liquid for Forming Specific Protective Layer

In the formation of the specific protective layer according to the invention, silica-coated fine particles and optional organic resin fine particles supplied in powder form may be directly added to and dispersed in the aqueous solution of the water-soluble polymer such as polyvinyl alcohol, which is a main component of the protective layer. The dispersion may be conducted with a known simple disperser such as a homogenizer, a homomixer, a ball mill, or a paint shaker.

In order to improve the dispersion stability, a surfactant may be added to the system as desired. The surfactant used to improve the dispersion stability may be a nonionic surfactant, an anionic surfactant, and/or a cationic surfactant.

Examples of the nonionic surfactant include polyethylene glycol alkyl ethers, alkenyl ethers, polyethylene glycol alkyl esters, and polyethylene glycol aryl ethers. Examples of the anionic surfactant include alkyl or aryl sulfonate surfactants, alkyl or aryl sulfate surfactants, alkyl or aryl phosphate surfactants, and alkyl or aryl carboxylate surfactants. Examples of the cationic surfactant include alkylamine surfactants, alkylpyridinium surfactants, and alkylammonium surfactants.

Specific examples of the surfactants include those described in "Saishin KaimenKasseizai no Kinososei, Sozaikaihatsu, Oyogijutsu", edited by Teruo Horiuchi, Toshiyuki Suzuki, published by Gijutsu Kyoiku Syuppansha".

In the cases where fine particles of CHEMIPEARL manufactured by Mitsui Chemicals, Inc., which is supplied as an aqueous dispersion, are used as the silica-coated fine particles, the dispersion is directly added to the protective layer aqueous solution, and stirred to make a protective layer coating liquid.

In addition to the above-described components, the specific protective layer may contain various additives according to the desired use within a range which does not impair the effect of the invention.

For example, a coloring agent (water-soluble dye) which has excellent permeability to rays used for exposing the recording layer (infrared rays in the invention) and efficiently absorbs rays having a wavelength not involved in the exposure may be contained to improve the safelight suitability without decrease in the sensitivity.

[Structure of Protective Layer]

The protective layer in the planographic printing plate precursor of the invention may have a monolayer structure or a laminated structure having a plurality of layers. When the protective layer is composed of a plurality of layers, the uppermost layer contains the silica-coated fine particles.

Mica Compound

The protective layer in the planographic printing plate precursor of the invention preferably contains a mica compound in any one of the constituent layers from the viewpoint of improving the oxygen-blocking property. The mica compound is contained in at least one of constituent layers of the protective layer.

For example, in the case where the protective layer has a monolayer structure having a specific protective layer, and the specific protective layer serves as the uppermost layer, the water-soluble polymer, silica-coated fine particles, and mica compound are contained in the specific protective layer. On the other hand, in the case where the protective layer has a laminated structure, the water-soluble polymer and silica-coated fine particles are contained in the uppermost layer, and the mica compound may be contained in the uppermost layer, or in the other layer in the vicinity of the recording layer together with a binder, preferably a water-soluble polymer.

Examples of the mica particles for use in the invention include natural and synthetic micas represented by Formula: $A(B,C)_2\text{-}5D_4O_{10}(OH,F,O)_2$ wherein A represents K, Na, or Ca; each of B and C represents Fe(II), Fe(III), Mn, Al, Mg, or V; and D represents Si or Al.

Among the micas usable in the invention, examples of the natural micas include white mica, soda mica, gold mica (phlogopite), black mica, and scaly mica (lepidolite). Examples of the synthetic micas include non-swelling micas such as fluorophlogopite $KMg_3(AlSi_3O_{10})F_2$ and potassium tetrasilicic mica $KMg_{2.5}(Si_4O_{10})F_2$; and swelling micas such as sodium tetrasilicic mica $NaMg_{2.5}(Si_4O_{10})F_2$, Na or Li type teniolite $(Na,Li)Mg_2Li(Si_4O_{10})F_2$, and montmorillonite Na or Li hectorite $(Na,Li)_{1/8}Mg_{2/5}Li_{1/8}(Si_4O_{10})F_2$; and the like. Synthetic smectites are also useful.

In the invention, fluorine-containing swelling micas are particularly useful among the mica compounds mentioned above. The swelling synthetic micas have a laminated structure of unit crystal lattice layers having a thickness of approximately 100 to 150 nm (10 to 15 Å), and show metal atoms substitution in lattices at much higher degree than other clay minerals. As a result, the lattice layers become deficient in the amount of positive charges, and cations such as $Na^+$, $Ca^{2+}$, or $Mg^{2+}$ are absorbed between the layers to compensate the deficiency. The cations present between the layers are called exchangeable cations and can be exchanged with various cations. When the cations between the layers are $Li^+$ or $Na^+$ in particular, the small ionic radii provide weak linkage of crystal-layer lattices, and thus the mica compound swells significantly with water. If a shear is applied to the mica compound in that state, the mica compound is easily cleaved and form stable sol in water. Swelling synthetic micas strongly tend to show that property and they are preferred in the present invention. In particular, swelling synthetic mica can be preferably used.

The mica compound used in the invention has a tabular particle shape. The thickness is preferably smaller from the viewpoint of adsorption on the organic resin fine particles, and the plate size is preferably larger within the range which does not inhibit the smoothness of the coated surface or permeability to active lights. Accordingly, the aspect ratio is preferably 20 or more, more preferably 100 or more, and still more preferably 200 or more. The aspect ratio is a ratio of thickness to the major axis of a particle, and is measured from, for example, a microphotographic projection drawing of the particle. The higher the aspect ratio is, the higher the effect is.

Particles of the mica compound for use in the protective layer in the invention preferably have an average major axis length of 0.3 to 20 μm, more preferably 0.5 to 10 μm, and still more preferably 1 to 5 μm. The average thickness of the particles is preferably 0.1 μm or less, more preferably 0.05 μm or less, and still more preferably 0.01 μm or less. Specifically, for example, typical swelling synthetic mica has a thickness of 1 to 50 nm and a face size (major axis length) of approximately 1 to 20 μm.

When the mica compound and the silica-coated fine particles are contained in the same layer, the content of the mica compound in the protective layer depends on the addition amount and kind of the silica-coated fine particles. In general, the weight ratio of the mica particles to the silica-coated fine particles is preferably in the range of 3:1 to 2:3, and more preferably in the range of 2:1 to 1:1.

When the weight ratio is within the above-described range, the silica-coated fine particles exhibit improved dispersibility and improved scratch resistance when rubbed against the rear surface of the Al support. Even when plural kinds of mica compounds are used in combination, the total amount of these mica compounds must be within the above-described weight ratio.

In the case where the protective layer has a laminated structure, the mica compound is contained in any of the plural layers. If the layer containing the mica compound does not contain the silica-coated fine particles, it is preferable that 5 to 50 parts by mass of the mica compound(s) be added to 100 parts by mass of the water-soluble polymer(s).

Formation of Protective Layer

The protective layer in the invention is formed as follows: a dispersion liquid of the silica-coated fine particles is blended with a dispersion liquid of the mica compound under stirring, and the mixed dispersion liquid is mixed with a binder component containing polyvinyl alcohol (or an aqueous solution of a binder component containing polyvinyl alcohol) to make a protective layer coating liquid, and the liquid is applied to a recording layer to form a protective layer.

In the case where the protective layer has a multilayer structure in which the mica compound is contained in not the uppermost layer but a layer in the vicinity of the recording layer, the protective layer coating liquid for the uppermost layer is prepared as described above, and the layer containing the mica compound is formed by using a coating liquid composed of the dispersed mica compound that is prepared in accordance with the following method.

First, an example of a general method of dispersing the mica compound for use in the protective layer will be described. First, 5 to 10 parts by mass of a swelling mica compound, one of the preferable mica compounds described above, is added to 100 parts by mass of water, allowing the mica to become compatible and swell with water, and then, the mixture is dispersed in a dispersing machine. Examples of the dispersing machines used include various mills that disperse a system while directly applying a mechanical force to the system, high-speed-agitating dispersing machines having a great shearing force, and dispersing machines applying a high-strength ultrasonic energy. Typical examples thereof include a ball mill, a sand grinder mill, a visco mill, a colloid mill, a homogenizer, a dissolver, a polytron, a homomixer, a homoblender, Keddy mill, a jet agitator, capillary emulsifier, liquid siren, electromagnetic-distortion ultrasonic wave generator, and emulsifier having a Pallmann whistle. The dispersion of the mica compound at a concentration of 2 to 15 wt % prepared by the above method is highly viscous or in a gel state, and the storage stability thereof is extremely good.

When the mica compound is used together with the silica-coated fine particles and/or the organic resin particles in preparing a protective layer coating liquid using the dispersion of the mica compound, the dispersion of mica compound is preferably mixed with the aqueous dispersions of the silica-coated fine particles and organic resin particles, and the resultant is preferably sufficiently stirred and mixed with a binder component including polyvinyl alcohol (or an aqueous solution of a binder component including specific polyvinyl alcohol). When the mica compound is not used together with the silica-coated fine particles in the same layer, the dispersion of mica compound is mixed with the binder component.

Known additives such as a surfactant for improving coating property and a water-soluble plasticizer for improving the physical properties of film may be contained in the coating solution for protective layer.

Examples of the water-soluble plasticizers include propionamide, cyclohexanediol, glycerol, and sorbitol. In addition, a water-soluble (meth)acrylic polymer may be added to the system. Further, known additives for improvement of the adhesiveness between the protective layer and the recording layer and the storage stability of coating solution may be contained in the coating solution.

A method of forming the protective layer in the invention is not particularly limited, and the method described in U.S. Pat. No. 3,458,311 or JP-A No. 55-49729 may be used.

In the case where the protective layer according to the invention has a monolayer structure, the coating amount of the layer is preferably 0.1 g/m$^2$ to 4.0 g/m$^2$, and more preferably 0.3 g/m$^2$ to 3.0 g/m$^2$. When the coating amount is within the range, the protective layer maintains a good film strength, and has excellent scratch resistance. In addition, the permeability to light entering into the protective layer by exposure, and the oxygen-blocking property of the protective layer are maintained within appropriate ranges, and hence image quality or safelight suitability does not degrade.

In the case where the protective layer has a laminated structure, the coating amount of the uppermost layer containing the silica-coated fine particles is preferably 0.1 g/m$^2$ to 3.0 g/m$^2$, and more preferably 0.5 g/m$^2$ to 2.0 g/m$^2$. The coating amount of the protective layer provided between the uppermost layer and the recording layer is preferably 0.1 g/m$^2$ to 2.0 g/m$^2$, and more preferably 0.2 g/m$^2$ to 1.0 g/m$^2$.

In the case where the protective layer has a laminated structure, the layer provided between the uppermost layer and the recording layer preferably contains a water-soluble polymer having an excellent oxygen-blocking property and a mica compound from the viewpoint of achieving both the oxygen-blocking property and the matting property.

<Recording Layer>

The planographic printing plate precursor according to the invention has a recording layer (photosensitive layer) having sensitivity to a laser. The recording layer is a polymerizable negative-type recording layer composed essentially of at least one sensitizing dye, at least one polymerization initiator, at least one polymerizable compound, and at least one binder polymer, and as necessary, at least one coloring agent and other optional components.

Since the polymerizable negative-type recording layer in the invention is sensitive to lasers corresponding to the absorption wavelength(s) of the sensitizing dye(s), it may be sensitive to various lasers useful for CTP. For example, in the case where an infrared absorbent is used as a sensitizing dye, the infrared absorbent contained in the recording layer is electronically excited upon exposure to infrared laser light with high sensitivity, and actions accompanying the electronically excited state such as electron transfer, energy transfer, and heat generation (light to heat converting function) induce the polymerization initiator contained in the same recording layer to cause chemical change to generate radicals.

Possible mechanisms for generation of radicals include: 1. the heat generated by the light to heat converting function of the infrared absorbent thermally decomposes the polymerization initiator that will be described later (e.g., sulfonium salt), to generate radicals; 2. an excited electron generated in the infrared absorbent is transferred to the polymerization initiator (e.g., active halogen compound) to generate radicals; and 3. electron transfer from the polymerization initiator (e.g., borate compound) to the excited infrared absorbent generates radicals. The generated radicals initiate the polymerization reaction of the polymerizable compound, and the exposed area is cured to form an image region.

The planographic printing plate precursor of the embodiment described above, which has a recording layer containing an infrared absorbent as a sensitizing dye, is particularly favorable for use in direct printing with infrared laser beam having a wavelength of 750 to 1,400 nm, and shows an image-forming property better than that of the conventional recording printing plate precursors.

Hereinafter, the components used in the recording in the invention will be described.

Sensitizing Dye

The recording layer according to the invention contains, from the viewpoint of sensitivity, a sensitizing dye which absorbs rays having a predetermined wavelength corresponding to the exposure wavelength in the laser exposure.

The exposure to the rays having a wavelength absorbable by the sensitizing dye promotes the later-described radical generation reaction of the polymerization initiator and the resulting polymerization reaction of the polymerizable compound. Examples of the sensitizing dye include known spectral sensitizing dyes, and dyes or pigments which absorbs rays to interact with the photopolymerization initiator. The sensitizing dye is electronically excited with high sensitivity upon exposure to laser light having an appropriate wavelength, and the actions accompanying the electronically excited state such as electron transfer and energy transfer induce the later-described polymerization initiator to cause chemical change with high sensitivity to generate radicals.

The recording layer in the invention is sensitive to various wavelengths of rays from ultraviolet rays to visible rays and infrared rays according to the wavelength of rays absorbed by the sensitizing dye. For example, in the case where an infrared absorbent is used as a sensitizing dye, the recording layer is sensitive to infrared rays having a wavelength of 760 nm to 1200 nm. When a dye having a maximum absorption at a wavelength of 350 nm to 450 nm is used, the recording layer is sensitive to blue to violet visible rays.

Examples of the spectral sensitizing dye, which is preferable as a sensitizing dye in the invention, include polynuclear aromatics (e.g., pyrene, perylene, and triphenylene), xanthenes (e.g., fluorescein, eosine, erythrosine, rhodamineB, and rose bengal), cyanines (e.g., thiacarbocyanine and oxacarbocyanine), melocyanines (e.g., melocyanine and carbomelocyanine), thiazines (e.g., thionin, methylene blue, and toluidine blue), acridines (e.g., acridine orange, chloroflavine, and acriflavine), phthalocyanines (e.g., phthalocyanine and metallophthalocyanine), porphyrins (e.g., tetraphenyl porphyrin and center metal-substituted porphyrin), chlorophylls (e.g., chlorophyll, chlorophyllin, and center metal-substituted chlorophyll), metal complexes, anthraquinones (e.g., anthraquinone), and squaryliums (e.g., squarylium). These dyes are described in detail, for example, in JP-A No. 2005-250438, paragraphs [0188] to [0258]. The sensitizing dye in the invention may be appropriately selected from the above-described compounds.

Among them, the recording layer in the invention preferably contains the below-described infrared absorbent as a sensitizing dye.

The infrared absorbent is electronically excited with high sensitivity upon irradiation (exposure) with infrared laser, and generates heat energy through light to heat converting function in addition to the above-described electron transfer and energy transfer accompanying the electronically excited state, and thus is useful to cause the polymerization initiator to chemical change with higher sensitivity.

Examples of the infrared absorbent, which is a particularly preferable sensitizing dye in the invention, include dyes or pigments having an absorption maximum at a wavelength of 750 nm to 1400 nm.

Such a dye can be a commercially available dye, or a known dye disclosed in "Dye Handbook" edited by The Society of Synthetic Organic Chemistry, Japan and published in 1970. Specific examples thereof include an azo dye, a metal complex azo dye, a pyrazolone azo dye, a naphthoquinone dye, an anthraquinone dye, a phthalocyanine dye, a carbonium dye, a quinonimine dye, a methine dye, a cyanine dye, a squarylium dye, a pyrylium salt, and a metal thiolate complex.

The dye is preferably a cyanine dye disclosed in JP-A No. 58-125246, 59-84356, or 60-78787, a methine dye disclosed in JP-A No. 58-173696, 58-181690, or 58-194595, a naphthoquinone dye disclosed in No. 58-112793, 58-224793, 59-48187, 59-73996, 60-52940, or 60-63744, a squarylium dye disclosed in JP-A No. 58-112792, or a cyanine dye disclosed in U. K. Patent No. 434,875.

A near infrared ray absorption sensitizer disclosed in U.S. Pat. No. 5,156,938, a substituted arylbenzo(thio)pyrylium salt disclosed in U.S. Pat. No. 3,881,924, a trimethine thiapyrylium salt disclosed in JP-A No. 57-142645 (U.S. Pat. No. 4,327,169), a pyrylium compound disclosed in JP-A No. 58-181051, 58-220143, 59-41363, 59-84248, 59-84249, 59-146063, or 59-146061, a cyanine dye disclosed in JP-A No. 59-216146, a pentamethine thiopyrylium salt disclosed in U.S. Pat. No. 4,283,475, or a pyrylium compound disclosed in JP-B No. 5-13514, or 5-19702 is preferably used.

The dye is also preferably a near infrared ray absorption dye represented by Formula (I) or (II) of U.S. Pat. No. 4,756,993.

Moreover, the infrared ray absorption dye in the invention is also preferably a specific indolenine cyanine dye disclosed in JP-A No. 2002-278057, which will be illustrated below:

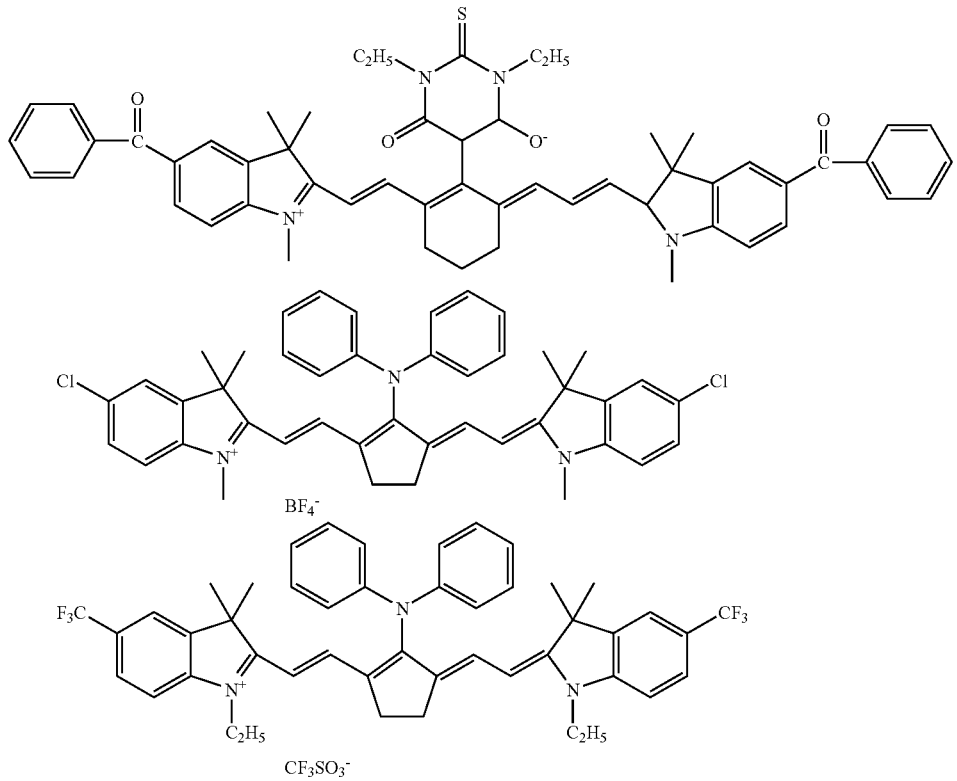

The infrared ray absorption dye in the invention is more preferably a cyanine dye, a squarylium dye, a pyrylium salt, a nickel thiolate complex, or an indolenine cyanine dye, still more preferably a cyanine dye or an indolenine cyanine dye, and particularly preferably a cyanine dye represented by the following Formula (a).

Formula (a)

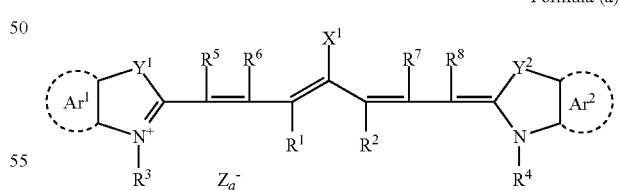

In formula (a), $X^1$ represents a hydrogen atom, a halogen atom, $-NPh_2$, $X^2-L^1$, or a group shown below. $X^2$ represents an oxygen atom, a nitrogen atom, or a sulfur atom, and $L^1$ represents a hydrocarbon group having 1 to 12 carbon atoms, an aromatic ring having at least one hetero atom, or a hydrocarbon group containing at least one hetero atom and having 1 to 12 carbon atoms. The hetero atom is N, S, O, a halogen atom, or Se.

In the following formula, definition of $X_a^-$ is the same as that of $Z_a^-$ described hereinafter, and $R^a$ represents a hydrogen atom or a substituent selected from alkyl groups, aryl groups, substituted or unsubstituted amino groups, and halogen atoms.

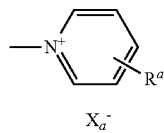

$R^1$ and $R^2$ each independently represent a hydrocarbon group having 1 to 12 carbon atoms. $R^1$ and $R^2$ is preferably a hydrocarbon group having two or more carbon atoms from the viewpoint of storage stability of a coating liquid for the recording layer. $R^1$ and $R^2$ particularly preferably bind to each other to form a five- or six-membered ring.

In formula (a), $Ar^1$ and $Ar^2$ may be the same or different, and represent an aromatic hydrocarbon group which may have at least one substituent. Typical examples of the aromatic hydrocarbon group include a benzene ring and a naphthalene ring. Also, typical examples of the substituent include a hydrocarbon group having 12 or less carbon atoms, halogen atoms and alkoxy groups having 12 or less carbon atoms. $Y^1$ and $Y^2$ may be the same or different, and represent a sulfur atom or a dialkylmethylene group having 12 or less carbon atoms. $R^3$ and $R^4$ may be the same or different, and represent a hydrocarbon group which may have at least one substituent and which has 20 or less carbon atoms. Typical examples of the substituent include alkoxy groups having 12 or less carbon atoms, a carboxyl group and a sulfo group. $R^5$, $R^6$, $R^7$ and $R^8$ may be the same or different, and represent a hydrogen atom or a hydrocarbon group having 12 or less carbon atoms. In light of availability of raw materials, they are preferably hydrogen atoms. $Z_a^-$ represents a counter anion. However, $Z_a^-$ is not necessary, if the cyanine dye represented by Formula (a) has an anionic substituent in its structure, and therefore does not need for neutralization of charges due to a counter anion. $Z_a^-$ is preferably a halogen ion, a perchlorate ion, a tetrafluoro borate ion, a hexafluorophosphate ion or a sulfonate ion from the viewpoint of storage stability of the coating liquid for the recording layer. $Z_a^-$ is more preferably a perchlorate ion, a hexafluorophosphate ion or an arylsulfonate ion.

Typical examples of the cyanine dye represented by Formula (a) preferably used in the invention include those described in paragraph Nos. [0017] to [0019] in JP-A No. 2001-133969.

The cyanine dye is particularly preferably a specific indolenine cyanine dye described in JP-A No. 2002-278057.

The cyanine dye particularly preferably does not contain a halogen ion as a counter ion.

The pigment used in the invention may be a commercially available pigment or a pigment described in Color Index (C.I.) Handbook, "Latest Pigment Handbook" (edited by Japan Pigment Technique Association, and published in 1977), "Latest Pigment Applied Technique" (by CMC Publishing Co., Ltd. in 1986), and "Printing Ink Technique" (by CMC Publishing Co., Ltd. in 1984).

Examples of the pigment include black pigments, yellow pigments, orange pigments, brown pigments, red pigments, purple pigments, blue pigments, green pigments, fluorescent pigments, metal powder pigments, and polymer-bonded dyes. Specifically, insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black can be used. The pigment is preferably carbon black.

These pigments may or may not be surface-treated. Examples of the surface treatment include a method of coating the surface of the pigment with a resin or wax; a method of adhering a surfactant onto the surface; and a method of bonding a reactive material (such as a silane coupling agent, an epoxy compound, or a polyisocyanate) to the surface. The surface treatment methods are described in "Nature and Application of Metal Soap" (Saiwai Shobo), "Printing Ink Technique" (by CMC Publishing Co., Ltd. in 1984), and "Latest Pigment Applied Technique" (by CMC Publishing Co., Ltd. in 1986).

The diameter of the pigment particle is preferably in the range of 0.01 to 10 μm, more preferably in the range of 0.05 to 1 μm, and still more preferably in the range of 0.1 to 1 μm. Pigment particles having a diameter within this preferable range are stably dispersed in the recording layer and thus enable formation of a uniform recording layer.

The pigment may be dispersed by a known dispersing technique used in the production of an ink or a toner. Examples of a dispersing machine used therein include an ultrasonic disperser, a sand mill, an attritor, a pearl mill, a super mill, a ball mill, an impeller, a disperser, a KD mill, a colloid mill, a dynatron, a three-roll mill, and a pressing kneader, of which the details are described in "Latest Pigment Applied Technique" (by CMC Publishing Co., Ltd. in 1986).

When used in the recording layer, the infrared absorbent and other components may be contained in the same layer together or in separate layers.

From the viewpoints of uniformity of the sensitizing dye, preferably the infrared ray absorbent, in the recording layer and durability of the recording layer, the content of the infrared ray absorbent in the recording layer is preferably 0.01 to 50% by mass, more preferably 0.1 to 10% by mass relative to the total solid content of the recording layer. The content of the sensitizing dye is preferably 0.5 to 10% by mass (in the case where the sensitizing dye is a dye) or 0.1 to 10% by mass (in the case where the sensitizing dye is a pigment).

Polymerization Initiator

The polymerization initiator used in the invention may be any compound that has a function of initiating and advancing the curing reaction of a polymerizable compound described hereinafter and can generate radicals due to application of energy. Such a compound can be a thermal decomposition-type radical generator that, when heated, decomposes to generate radicals, an electron transfer-type radical generator that receives an excited electron from the infrared ray absorbent to generate radicals, or an electron transfer-type radical generator that generates electrons, which move to the excited infrared ray absorbent so as to generate radicals. Specific examples thereof include onium salts, activated halogen compounds, oxime ester compounds, and borate compounds. Two or more of these initiators may be used together. In the invention, the polymerization initiator is preferably an onium salt, and more preferably a sulfonium salt.

The sulfonium salt polymerization initiator preferably used in the invention can be an onium salt represented by the following Formula (1).

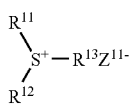

Formula (I)

In formula (1), $R^{11}$, $R^{12}$ and $R^{13}$ may be the same or different, and each represents a hydrocarbon group having 20 or less carbon atoms which may have at least one substituent. Examples of the substituent include halogen atoms, a nitro group, alkyl groups having 12 or less carbon atoms, alkoxy groups having 12 or less carbon atoms, and aryloxy groups having 12 or less carbon atoms. $Z^{11-}$ represents a counter ion selected from the group consisting of a halogen ion, a perchlorate ion, a tetrafluoroborate ion, a hexafluorophosphate ion, a carboxylate ion, and a sulfonate ion. $Z^{11-}$ is preferably a perchlorate ion, a hexafluorophosphate ion, a carboxylate ion, or an arylsulfonate ion.

Hereinafter, typical examples of the onium salt represented by Formula (1), [OS-1] to [OS-12] are shown below, but the invention is not limited by them.

[OS-1]

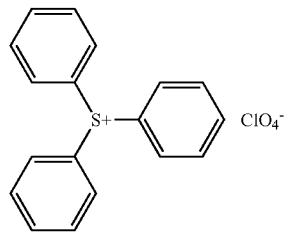

[OS-2]

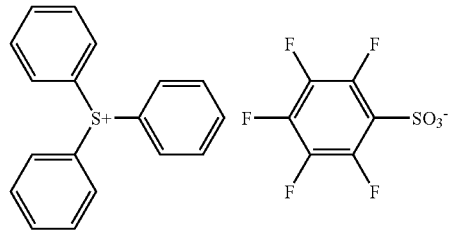

[OS-3]

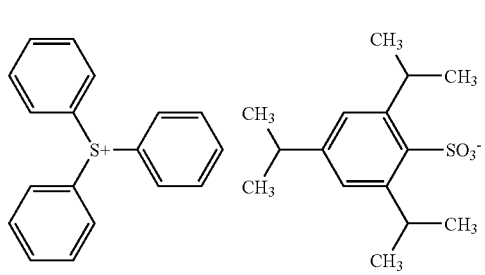

[OS-4]

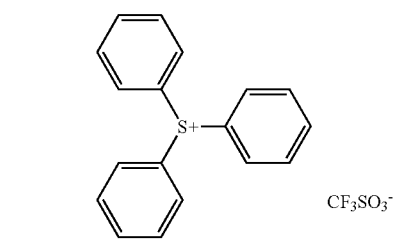

[OS-5]

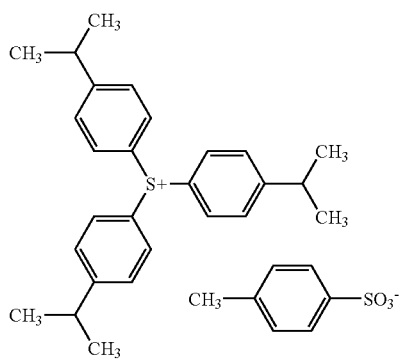

[OS-6]

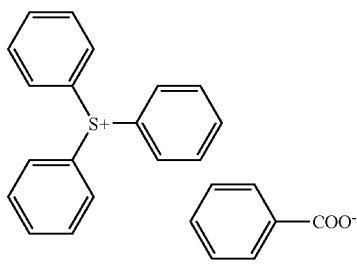

[OS-7]

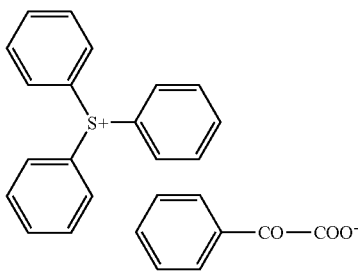

[OS-8]

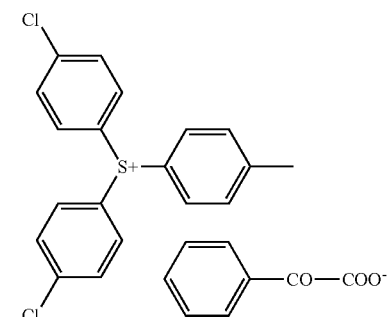

[OS-9]

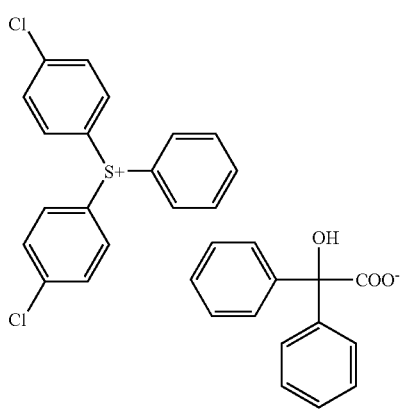

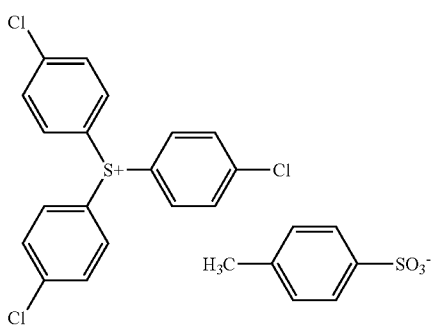

[OS-10]

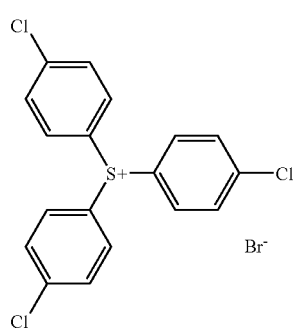

[OS-11]

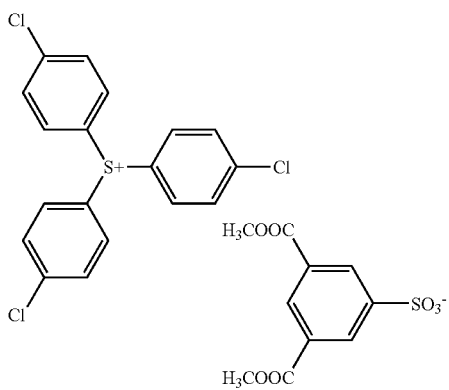

[OS-12]

In addition, specific aromatic sulfonium salts described in JP-A Nos. 2002-148790, 2002-350207, and 2002-6482 are also preferably used as the polymerization initiator.

In the invention, not only the sulfonium salt polymerization initiator, but also other polymerization initiators (other radical generators) may also be used. Examples of other radical generators include onium salts other than sulfonium salts, triazine compounds having a trihalomethyl group, peroxides, azo polymerization initiators, azide compounds, quinone diazide, activated halogen compounds, oxime ester compounds, and triaryl monoalkyl borate compounds. Among them, onium salts are preferably used, since they are highly sensitive. In addition, any of these polymerization initiators (radical generators) may be used together with the above-described sulfonium salt polymerization initiator, which is used as an essential component.

Examples of the other onium salts which can be used preferably in the invention include iodonium salts and diazonium salts. In the invention, these onium salts function as radical polymerization initiators rather than as acid generating agents.

The onium salts represented by the following Formulae (2) and (3) can also be used.

$$Ar^{21}-I^+-Ar^{22}Z^{21-} \quad \text{Formula (II)}$$

$$Ar^{31}-N^+{\equiv}NZ^{31-} \quad \text{Formula (III)}$$

In formula (II), $Ar^{21}$ and $Ar^{22}$ each independently represent an aryl group having 20 carbon atoms or less which may have at least one substituent. When the aryl group has at least one substituent, typical examples of the substituent include halogen atoms, a nitro group, alkyl groups having 12 or less carbon atoms, alkoxy groups having 12 or less carbon atoms, and aryloxy groups having 12 or less carbon atoms. $Z^{21-}$ is a counter ion having the same definition as that of $Z^{11-}$.

In formula (III), $Ar^{31}$ represents an aryl group having 20 or less carbon atoms which may have at least one substituent. Typical examples of the substituent include halogen atoms, a nitro group, alkyl groups having 12 or less carbon atoms, alkoxy groups having 12 or less carbon atoms, aryloxy groups having 12 or less carbon atoms, alkylamino groups having 12 or less carbon atoms, dialkylamino groups having 12 or less carbon atoms, arylamino groups having 12 or less carbon atoms, and diarylamino groups having 12 or less carbon atoms. $Z^{31-}$ is a counter ion having the same definition as that of $Z^{11-}$.

As the typical examples of the onium salt represented by Formula (II), [OI-1] to [OI-10] and as the onium salt represented by Formula (III), [ON-1] to [ON-5] are shown below, but the invention is not limited by them.

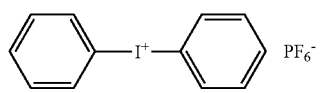

[OI-1]

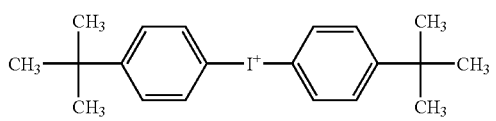

[OI-2]

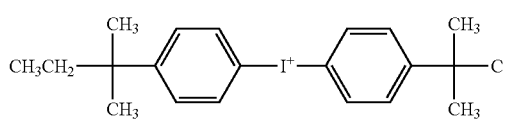

[OI-3]

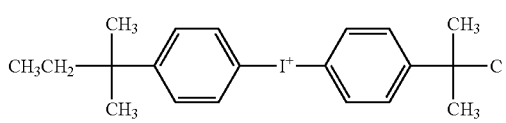

[OI-4]

-continued
[OI-5] 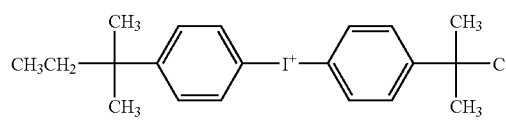
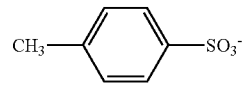
[OI-6] 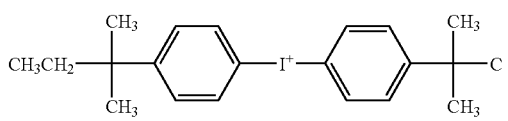
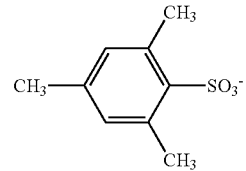
[OI-7] 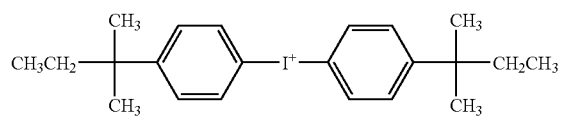
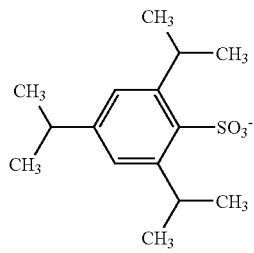
[OI-8] 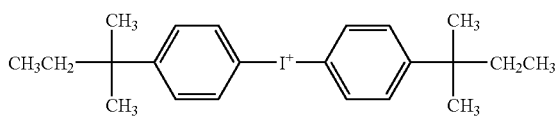
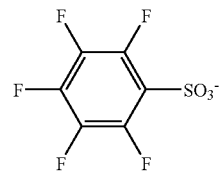
[OI-9]
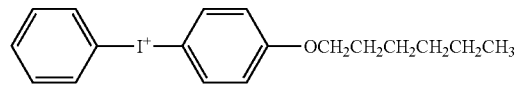
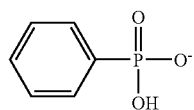
[OI-10]
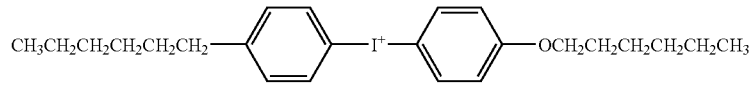
[ON-1] 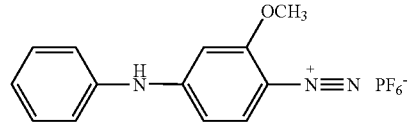
[ON-2] 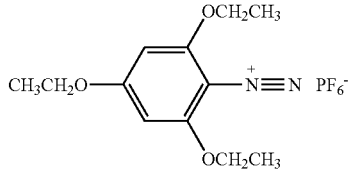
[ON-3] 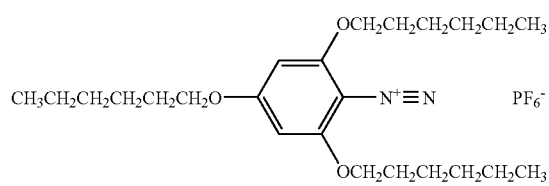
[ON-4] 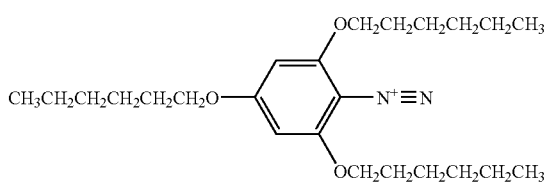
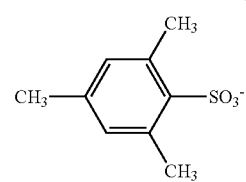

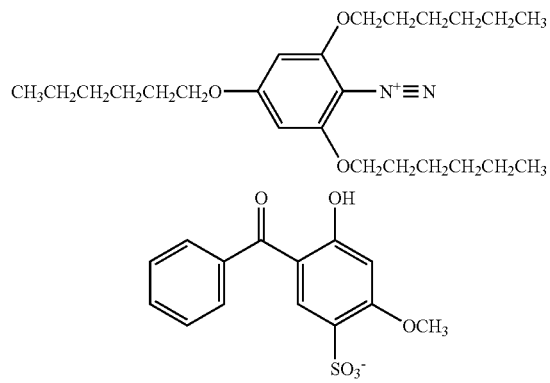

[ON-5]

Specific examples of the onium salts preferably used as the polymerization initiator (radical generator) in the invention include those described in JP-A No. 2001-133696.

Further, the polymerization initiator (radical generator) used in the invention preferably has a maximum absorption wavelength of 400 nm or less, and more preferably has a maximum absorption wavelength of 360 nm or less. When the polymerization initiator (radical generator) has its absorption wavelength in the UV range, the planographic printing plate precursor can be handled under a white lamp.

The total content of the polymerization initiator(s) in the invention is generally 0.1 to 50% by mass, preferably 0.5 to 30% by mass, and more preferably 1 to 20% by mass relative to the total solid matters of the recording layer from the viewpoints of sensitivity and prevention of stains on the non-image portion during printing.

In the invention, a polymerization initiator may be used or two or more polymerization initiators can be used together. When two or more polymerization initiators are used together, two or more sulfonium salt polymerization initiators may be used, or a combination of a sulfonium salt polymerization initiator and any other polymerization initiators may be used.

When a sulfonium salt polymerization initiator and another polymerization initiator are used in combination, the mass ratio of these initiators is preferably 100/1 to 100/50 and more preferably 100/5 to 100/25.

In addition, the polymerization initiator and the other component may be contained in the same layer or in different layers.

When a highly sensitive sulfonium salt serving as a typical polymerization initiator is used in the recording layer in the invention, the radical polymerization reaction effectively proceeds and the strength of an image portion formed is very strong. Accordingly, when a recording layer is combined with a protective layer described hereinafter, which has a high oxygen-blocking function, a planographic printing plate having a very high strength of the image portion can be produced, and consequently the printing durability of the plate is further improved. Further, the sulfonium salt polymerization initiator is superior in storability over time, and, when a planographic printing plate precursor containing the sulfonium salt polymerization initiator is stored, an undesirable polymerization reaction is effectively suppressed.

Polymerizable Compound

The polymerizable compound used in the invention is an addition-polymerizable compound having at least one ethylenically unsaturated double bond, and is selected from compounds having at least one, preferably 2 or more, ethylenically unsaturated double bonds. Such compounds are widely known in this industrial field, and any of these compounds may be used in the invention, which are not particularly limited. These have a chemical form such as, for example, a monomer, a prepolymer, i.e., a dimer, a trimer and an oligomer, or a mixture or a copolymer of two or more of these compounds. Examples of the monomer and the copolymer thereof include unsaturated carboxylic acids (e.g., acrylic acid, methacrylic acid, itaconic acid, crotonic acid, isocrotonic acid, and maleic acid), and esters and amides thereof. The polymerizable compound is preferably an ester of an unsaturated carboxylic acid and an aliphatic polyhydric alcohol compound, or an amide of an unsaturated carboxylic acid and an aliphatic polyvalent amine compound. In addition, an addition reaction product of an unsaturated carboxylate having a nucleophilic substituent such as a hydroxyl group, an amino group or a mercapto group, or an amide thereof, and a monofunctional or polyfunctional isocyanate, or an epoxy compound; and a dehydration condensation reaction product of such an unsaturated carboxylate or an amide, and a monofunctional or polyfunctional carboxylic acid may be preferably used. Furthermore, an addition reaction product of an unsaturated carboxylate having an electrophilic substituent such as an isocyanate group or an epoxy group, or an amide thereof, and a monofunctional or polyfunctional alcohol, amine or thiol; a substitution reaction product of an unsaturated carboxylate having a leaving substituent such as halogen atoms or a tosyloxy group, or an amide thereof, and a monofunctional or polyfunctional alcohol, amine or thiol are also preferably used. Alternatively, monomers and prepolymers, and mixtures and copolymers thereof which are the same as the above except that the aforementioned unsaturated carboxylic acid is replaced with an unsaturated phosphonic acid, styrene, or vinyl ether may also be used.

Specific examples of the ester monomer of an aliphatic polyhydric alcohol compound and an unsaturated carboxylic acid include acrylates, methacrylates, itaconates, crotonates, isocrotonates, and maleates. Examples of acrylates include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, and polyester acrylate oligomer.

Examples of the methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of the itaconates include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonates include ethylene glycol dicrotonate, tetramethylene glycol dicrotonate, pentaerythritol dicrotonate, and sorbitol tetradicrotonate.

Examples of the isocrotonates include ethylene glycol diisocrotonate, pentaerythritol diisocrotonate, and sorbitol tetraisocrotonate.

Examples of the maleates include ethylene glycol dimaleate, triethylene glycol dimaleate, pentaerythritol dimaleate, and sorbitol tetramaleate.

Examples of other esters include aliphatic alcohol esters described in JP-B Nos. 46-27926 and 51-47334, and JP-A No. 57-196231, those having an aromatic skeleton and described in JP-A Nos. 59-5240, 59-5241 and 2-226149, those containing an amino group and described in JP-A No. 1-165613. Moreover, the ester monomers described above may be used as a mixture.

Specific examples of the amide monomer of an aliphatic polyvalent amine compound and an unsaturated carboxylic acid include methylenebis-acrylamide, methylenebis-methacrylamide, 1,6-hexamethylenebis-acrylamide, 1,6-hexamethylenebis-methacrylamide, diethylene triamine trisacrylamide, xylylenebis-acrylamide, and xylylenebis-methacrylamide. Other examples of preferred amide-monomers include those having a cyclohexylene structure and described in JP-B No. 54-21726.

Further, the polymerizable compound in the invention is also preferably an addition-polymerizable urethane compound produced by addition reaction of an isocyanate and a hydroxyl group-containing compound. Typical examples thereof include vinyl urethane compounds described in JP-B No. 48-41708. The vinyl urethane compounds contains two or more polymerizable vinyl groups in a molecule thereof, and are produced by adding a hydroxyl group-containing vinyl monomer represented by the Formula:

$$CH_2=C(R^a)COOCH_2CH(R^b)OH$$

(wherein $R^a$ and $R^b$ each represent H or $CH_3$), to a polyisocyanate compound containing two or more isocyanate groups in a molecule thereof.

Further, urethane acrylates as described in JP-A No. 51-37193 and JP-B Nos. 2-32293 and 2-16765 and urethane compounds each having an ethylene oxide skeleton as described in JP-B Nos. 58-49860, 56-17654, 62-39417 and 62-39418 may also be suitably used as the polymerizable compound. Furthermore, when any of addition-polymerizable compounds each having an amino structure or a sulfide structure in a molecule thereof described in JP-A Nos. 63-277653, 63-260909 and 1-105238 is used as the polymerizable compound, a photopolymerizable composition that is considerably excellent in photosensitizing speed can be obtained.

Other examples of the polymerizable compound include multifunctional acrylates and methacrylates such as polyester acrylates as described in JP-A No. 48-64183, and JP-B Nos. 49-43191 and 52-30490, and epoxy acrylates obtained by reacting an epoxy resin with (meth)acrylic acid. Furthermore, specific unsaturated compounds described in JP-B Nos. 46-43946, 1-40337 and 1-40336, and vinylphosphonic acid compounds described in JP-A No. 2-25493 may also be used as the polymerizable compound. Moreover, in some instances, compounds having a structure with a perfluoroalkyl group, which are described in JP-A No. 61-22048, may be appropriately used. In addition, photo-curable monomers and oligomers described in "Nippon Setchaku Kyokai Shi (Journal of Japanese Adhesive Society)", Vol. 20, No. 7, pages 300-308 (1984) may also be used.

Details of these addition-polymerizable compounds, for example, the structure thereof, and the method of use thereof such as use of only one of the compounds, use of two or more of the compounds, and the amount(s) of the compound(s) used, can be arbitrarily determined depending on the desired performance of a final planographic printing plate precursor. For example, they are selected from the following viewpoints. From the viewpoint of photosensitizing speed, the addition-polymerizable compound preferably has a large number of unsaturated groups in one molecule, and in many cases, they are preferably bifunctional or more. In order to increase the strength of the image portions, i.e. the cured layer, the addition-polymerizable compounds are preferably trifunctional or more. It is also effective to regulate both photosensitivity and strength by combining compounds (e.g. acrylates, methacrylates, styrene compounds, and vinyl ether compounds) having different functionalities and different polymerizable groups. Although the high-molecular compounds or highly hydrophobic compounds have excellent photosensitizing speed and film strength, they may decelerate developing speed and tend to easily precipitate in the developing solution, and are not therefore preferably used in some cases. Selection and use of the addition-polymerizable compound is an important factor for compatibility between the compound and other components (e.g. a binder polymer, an initiator, and a coloring agent) and dispersibility thereof in the recording layer compound. For example, the compatibility may be improved by using a compound having a low purity or a combination of two or more compounds.

A planographic printing plate precursor having a specific structure may be selected for the purpose of improving adhesiveness between the recording layer and a protective layer or a support as described hereinafter.

The content of the addition-polymerizable compound in the recording layer composition is preferably in the range of 5 to 80% by mass and more preferably in the range of 40 to 75% by mass relative to the solid content of the recording layer composition, from the viewpoints of sensitivity, phase separation, adhesiveness of the recording layer and a precipitating property of the addition-polymerizable compound in a developing solution.

One of these compounds may be used or two or more of them can be used together. In addition, as for use of the addition-polymerizable compound, the structure, the composition, and the addition amount thereof can be selected properly as needed, considering the extent of inhibition of polymerization caused by oxygen, resolution and the fogging property, change in refractive index, and surface adhesion.

Further, a layer configuration containing an undercoat and/or an overcoat and a coating method of these coatings may also be applied to the planographic printing plate precursor of the invention.

Binder Polymer

The binder polymer used in the invention has a function of improving layer properties, and therefore, any polymers that have a function of improving layer properties can be used as the binder polymer. A binder polymer having a repeating unit represented by the following Formula (i) is used as the binder polymer in the invention. Hereinafter, the binder polymer having a repeating unit represented by Formula (i) will be referred to as a specific binder polymer and will be described in detail hereinafter.

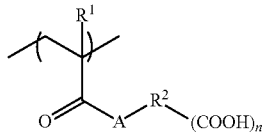

Formula (i)

In formula (i), $R^1$ represents a hydrogen atom or a methyl group; $R^2$ represents a connecting group which includes two or more atoms selected from the group consisting of a carbon atom, a hydrogen atom, an oxygen atom, a nitrogen atom and a sulfur atom and which has 2 to 82 atoms in total; A represents an oxygen atom or —$NR^3$—; $R^3$ represents a hydrogen atom or a monovalent hydrocarbon group having 1 to 10 carbon atoms; and n represents an integer of 1 to 5.

$R^1$ in formula (i) represents a hydrogen atom or a methyl group, and is preferably a methyl group.

The connecting group represented by $R^2$ in formula (i) contains two or more atoms selected from the group consisting of a carbon atom, a hydrogen atom, an oxygen atom, a nitrogen atom, and a sulfur atom. The connecting group has 2 to 82 atoms in total, preferably has 2 to 50 atoms in total, and more preferably has 2 to 30 atoms in total. If the connecting group has at least one substituent, the total number of atoms includes the number of atoms of the substituent(s). More specifically, the number of atoms of the main skeleton of the connecting group represented by $R^2$ is preferably 1 to 30, more preferably 3 to 25, still more preferably 4 to 20, and most preferably 5 to 10. The term "main skeleton of the connecting group" refers to an atom or an atomic group connecting "A" and the terminal COOH group in formula (i). In particular, when the connecting group has a plurality of connecting routes, the main skeleton of the connecting group refers to an atom or an atomic group forming the shortest connection between "A" and the terminal COOH group. Accordingly, when the connecting group includes a cyclic structure therein, the number of the atoms to be counted may vary depending on the connecting position (e.g., ortho, meta, or para).

Specific examples of the connecting group include substituted or unsubstituted alkylene, substituted or unsubstituted arylene, and groups in which these bivalent groups are connected via at least one amide or ester bond.

Examples of connecting groups having a chain structure include ethylene, and propylene. Connecting groups in which these alkylenes are connected to each other via at least one ester bond is also preferably used.

The connecting group represented by $R^2$ in formula (i) is preferably a hydrocarbon group having an alicyclic structure with 3 to 30 carbon atoms and a valence of (n+1). Specific examples of such a compound include hydrocarbon groups having a valence of (n+1) and obtained by removing (n+1) hydrogen atoms each bonding to one of carbon atoms of an alicyclic hydrocarbon compound, such as cyclopropane, cyclopentane, cyclohexane, cycloheptane, cyclooctane, cyclodecane, dicyclohexyl, tercyclohexyl, and norbornane, which may have at least one substituent. In addition, $R^2$ preferably has 3 to 30 carbon atoms which include carbon atoms of the substituent(s).

One or more carbon atoms of the compound having an alicyclic structure may optionally be substituted by at least one hetero atom selected from a nitrogen atom, an oxygen atom and a sulfur atom. In view of printing durability, $R^2$ is preferably a hydrocarbon group which has an alicyclic structure and a valence of (n+1), which may have a substituent, and which has 5 to 30 carbon atoms and includes two or more rings, such as a condensed polycyclic aliphatic hydrocarbon, a crosslinked alicyclic hydrocarbon, a spiro aliphatic hydrocarbon or compounds having aliphatic hydrocarbon rings connected with each other via a bond or a connecting group. Also in this instance, the number of carbon atoms involves the number of carbon atoms included in the substituent(s).

The connecting group represented by $R^2$ is particularly preferably a group containing a main skeleton with 5 to 10 carbon atoms. Such a group preferably has a chain structure containing at least one ester bond therein or the cyclic structure described above.

Examples of the substituent which may be introduced into the connecting group represented by $R^2$ include monovalent non-metal atomic groups excluding hydrogen, such as halogen atoms (—F, —Br, —Cl and —I), a hydroxyl group, alkoxy groups, aryloxy groups, a mercapto group, alkylthio groups, arylthio groups, alkyldithio groups, aryldithio groups, an amino group, N-alkylamino groups, N,N-dialkylamino groups, N-arylamino groups, N,N-diarylamino groups, N-alkyl-N-arylamino groups, acyloxy group, a carbamoyloxy group, N-alkylcarbamoyloxy groups, N-arylcarbamoyloxy groups, N,N-dialkylcarbamoyloxy groups, N,N-diarylcarbamoyloxy groups, N-alkyl-N-arylcarbamoyloxy groups, alkylsulfoxy groups, arylsulfoxy groups, acylthio groups, acylamino groups, N-alkylacylamino groups, N-arylacylamino groups, an ureido group, N'-alkylureido groups, N',N'-dialkylureido groups, N'-arylureido groups, N',N'-diarylureido groups, N'-alkyl-N'-arylureido groups, N-alkylureido groups, N-arylureido groups, N'-alkyl-N-alkylureido groups, N'-alkyl-N-arylureido groups, N',N'-dialkyl-N-alkylureido groups, N',N'-dialkyl-N-arylureido groups, N'-aryl-N-alkylureido groups, N'-aryl-N-arylureido groups, N',N'-diaryl-N-alkylureido groups, N',N'-diaryl-N-arylureido groups, N'-alkyl-N'-aryl-N-alkylureido groups, N'-alkyl-N'-aryl-N-arylureido groups, alkoxycarbonylamino groups, aryloxycarbonylamino groups, N-alkyl-N-alkoxycarbonylamino groups, N-alkyl-N-aryloxycarbonylamino groups, N-aryl-N-alkoxycarbonylamino groups, N-aryl-N-aryloxycarbonylamino groups, a formyl group, acyl groups, a carboxyl group and conjugated base groups thereof, alkoxycarbonyl groups, aryloxycarbonyl groups, a carbamoyl group, N-alkylcarbamoyl groups, N,N-dialkylcarbamoyl groups, N-arylcarbamoyl groups, N,N-diarylcarbamoyl groups, N-alkyl-N-arylcarbamoyl groups, alkylsulfinyl groups, arylsulfinyl groups, alkylsulfonyl groups, arylsulfonyl groups, a sulfo group (—$SO_3H$) and conjugated base groups thereof, alkoxysulfonyl groups, aryloxysulfonyl groups, a sulfinamoyl group, N-alkylsulfinamoyl groups, N,N-dialkylsulfinamoyl groups, N-arylsulfinamoyl groups, N,N-diarylsulfinamoyl groups, N-alkyl-N-arylsulfinamoyl groups, a sulfamoyl group, N-alkylsulfamoyl groups, N,N-dialkylsulfamoyl groups, N-arylsulfamoyl groups, N,N-diarylsulfamoyl groups, N-alkyl-N-arylsulfamoyl groups, N-acylsulfamoyl groups and conjugated base groups thereof, N-alkylsulfonylsulfamoyl groups (—SO$_2$NHSO$_2$(alkyl)) and conjugated base groups thereof, N-arylsulfonylsulfamoyl groups (—SO$_2$NHSO$_2$(aryl)) and conjugated base groups thereof, N-alkylsulfonylcarbamoyl groups (—CONHSO$_2$(alkyl)) and conjugated base groups thereof, N-arylsulfonylcarbamoyl groups (—CONHSO$_2$(aryl)) and conjugated base groups thereof, alkoxysilyl groups (—Si(Oalkyl)$_3$), aryloxysilyl groups (—Si(Oaryl)$_3$), a hydroxysilyl group (—Si(OH)$_3$) and conjugated base groups thereof, a phosphono group (—PO$_3$H$_2$) and conjugated base groups thereof, dialkylphosphono groups (—PO$_3$(alkyl)$_2$), diarylphosphono groups (—PO$_3$(aryl)$_2$), alkylarylphosphono groups (—PO$_3$(alkyl)(aryl)), monoalkylphosphono groups (—PO$_3$H(alkyl)) and conjugated base groups thereof, monoarylphosphono groups (—PO$_3$H(aryl)) and conjugated base groups thereof, a phosphonoxy group (—OPO$_3$H$_2$) and conjugated base groups thereof, dialkylphosphonoxy groups (—OPO$_3$(alkyl)$_2$), diarylphosphonoxy groups (—OPO$_3$(aryl)$_2$), alkylarylphosphonoxy groups (—OPO$_3$(alkyl)(aryl)), monoalkylphosphonoxy groups (—OPO$_3$H(alkyl)) and conjugated base groups thereof, monoarylphosphonoxy groups (—OPO$_3$H(aryl)) and conjugated base groups thereof, a cyano group, a nitro group, dialkylboryl groups (—B(alkyl)$_2$), diarylboryl groups (—B(aryl)$_2$), alkylarylboryl groups (—B(alkyl)(aryl)), a dihydroxyboryl group (—B(OH)$_2$) and conjugated base groups thereof, alkylhydroxyboryl groups (—B(alkyl)(OH)) and conjugated base groups thereof, arylhydroxyboryl groups (—B(aryl)(OH)) and conjugated base groups thereof, aryl groups, alkenyl groups, and alkynyl groups.

In the planographic printing plate precursor of the invention, substituents having at least one hydrogen atom capable of forming a hydrogen bond, particularly, substituents having a smaller value of acid dissociation constant (pKa) than that of carboxylic acid are not preferred, because they are likely to reduce printing durability. However, such substituents may be used depending on the design of the recording layer. On the contrary, halogen atoms, hydrophobic substituents such as hydrocarbon groups (e.g., alkyl groups, aryl groups, alkenyl groups and alkynyl groups), alkoxy groups and aryloxy groups are preferred because they are likely to improve printing durability. In particular, when the cyclic structure is a mono-alicyclic hydrocarbon with a ring skeleton having 6 or less atoms, such as cyclopentane or cyclohexane, it preferably has the aforementioned hydrophobic substituent(s). These substituents may bind each other to form a ring, or may bind to the hydrocarbon group that has a substituent to form a ring, if possible. In addition, the substituent may have at least one substituent.

When A in formula (i) is NR$^3$—, R$^3$ represents a hydrogen atom or a monovalent hydrocarbon group having 1 to 10 carbon atoms. The monovalent hydrocarbon groups having 1 to 10 carbon atoms and represented by R$^3$ include alkyl groups, aryl groups, alkenyl groups, and alkynyl groups.

Typical examples of the alkyl groups include linear, branched, and cyclic alkyl groups having 1 to 10 carbon atoms, such as a methyl group, an ethyl group, a propyl group, a butyl group, a pentyl group, a hexyl group, a heptyl group, an octyl group, a nonyl group, a decyl group, an iso-propyl group, an iso-butyl group, a sec-butyl group, a tert-butyl group, an iso-pentyl group, a neopentyl group, a 1-methylbutyl group, an iso-hexyl group, a 2-ethylhexyl group, a 2-methylhexyl group, a cyclopentyl group, a cyclohexyl group, a 1-adamantyl group, and a 2-norbornyl group.

Typical examples of the aryl groups include aryl groups having 1 to 10 carbon atoms such as a phenyl group, a naphthyl group, and an indenyl group; and hetero aryl groups having 1 to 10 carbon atoms and containing at least one hetero atom selected from the group consisting of a nitrogen atom, an oxygen atom and a sulfur atom, such as a furyl group, a thienyl group, a pyrrolyl group, a pyridyl group, and a quinolyl group.

Typical examples of the alkenyl groups include linear, branched, and cyclic alkenyl groups having 1 to 10 carbon atoms, such as a vinyl group, a 1-propenyl group, a 1-butenyl group, a 1-methyl-1-propenyl group, a 1-cyclopentenyl group, and a 1-cyclohexenyl group.

Typical examples of the alkynyl groups include alkynyl groups having 1 to 10 carbon atoms, such as an ethynyl group, a 1-propynyl group, a 1-butynyl group, and a 1-octynyl group. R$^3$ may have at least one substituent, and examples of the substituent are the same as those of the substituent which can be introduced into R$^2$. However, the total number of carbon atoms of R$^3$ including the number of carbon atoms of the substituent(s) is 1 to 10.

"A" in formula (i) is preferably an oxygen atom or —NH—, from the viewpoint of easy synthesis of the compound.

"n" in formula (i) represents an integer of 1 to 5, and is preferably 1 from the viewpoint of printing durability.

Typical examples of the repeating unit represented by formula (i) are shown below, but the invention is not limited by them.

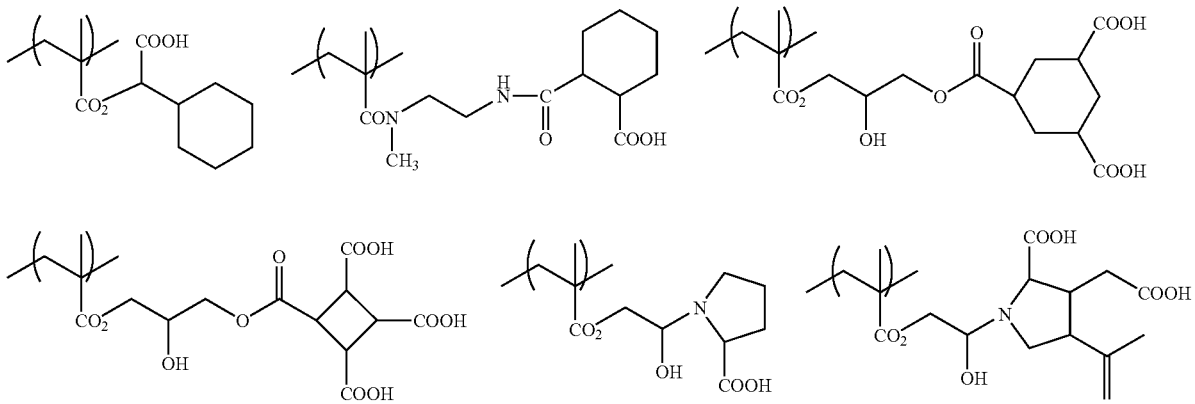

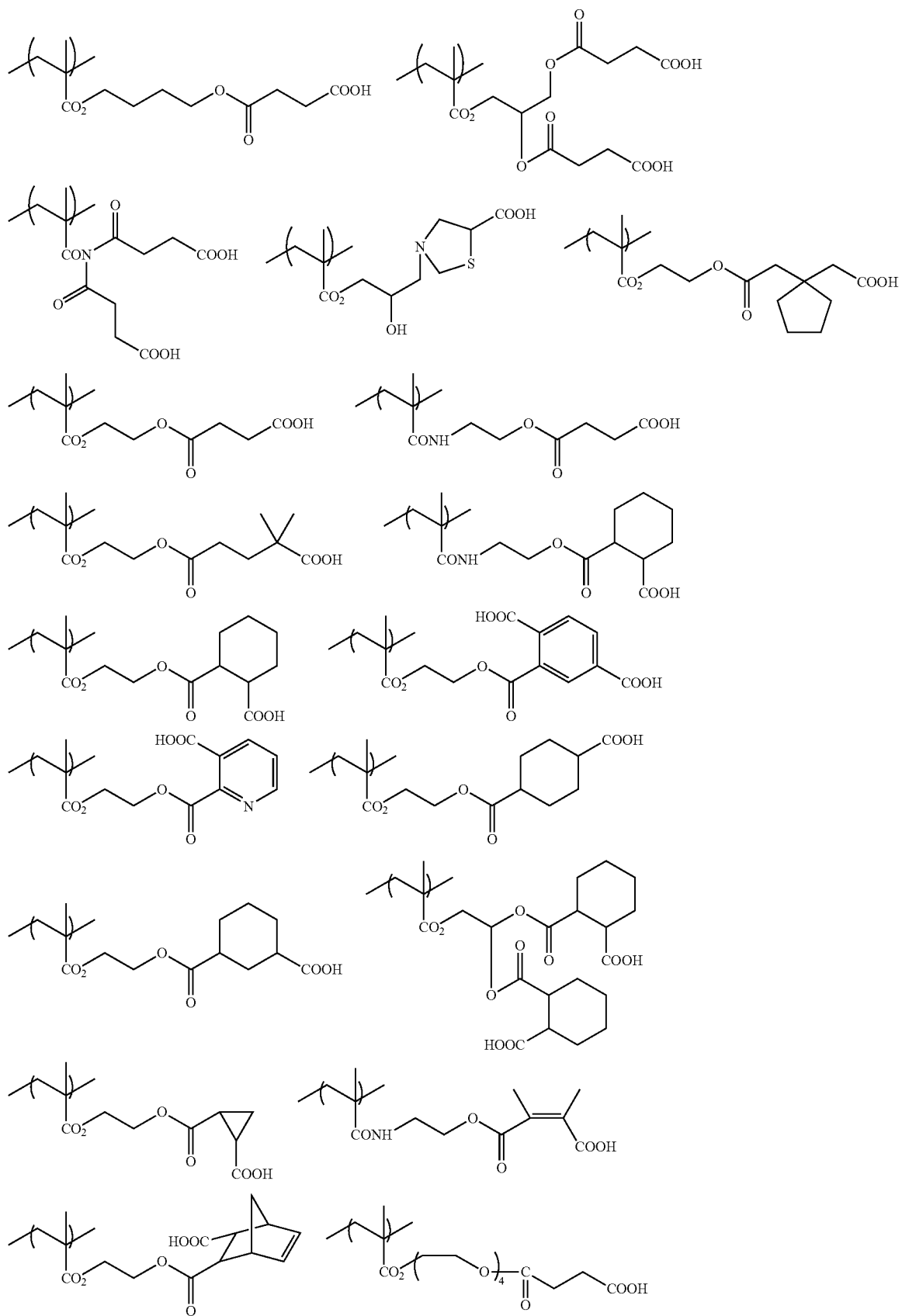

-continued
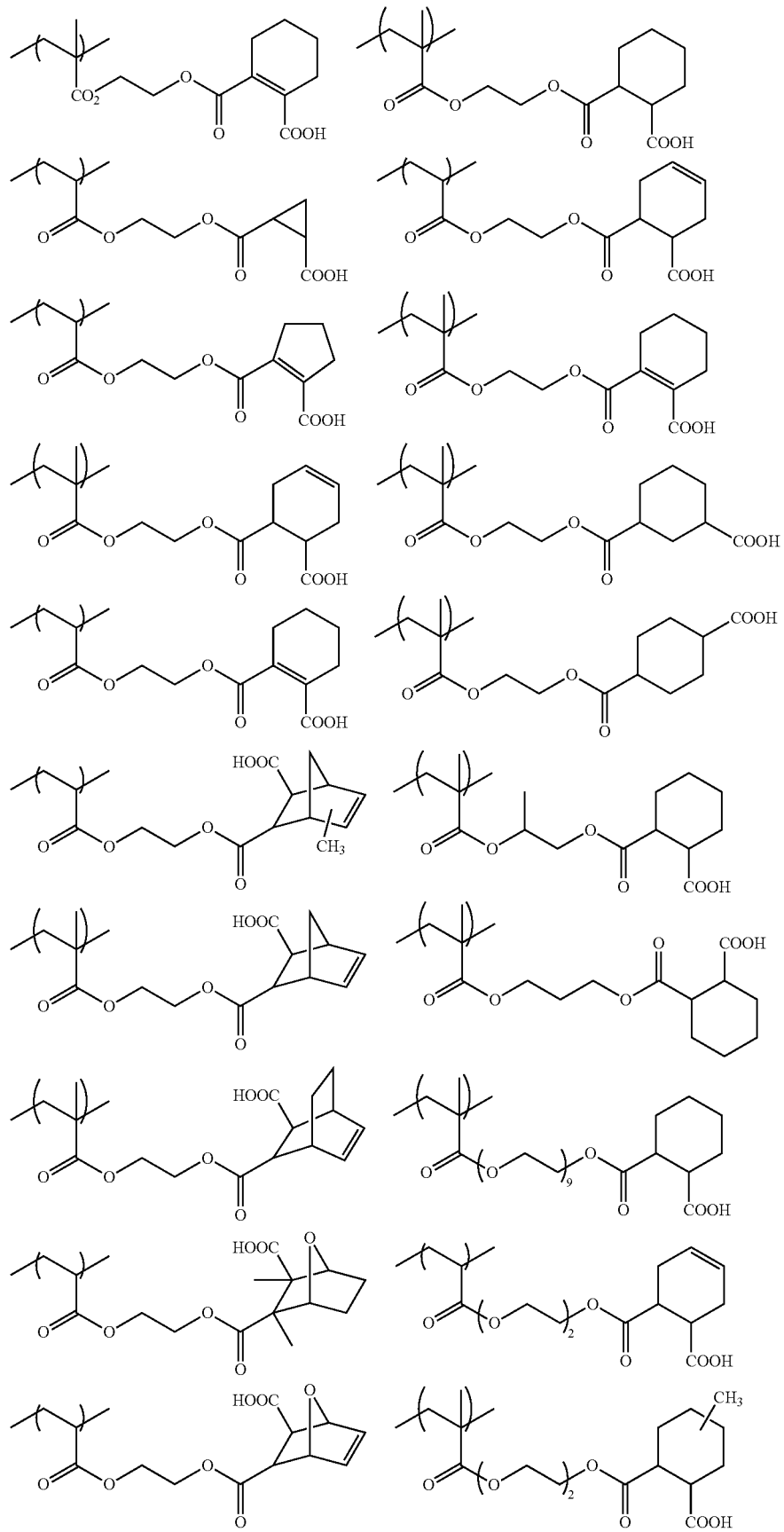

-continued
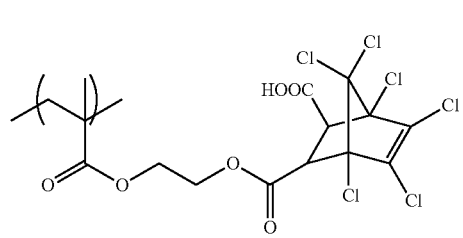
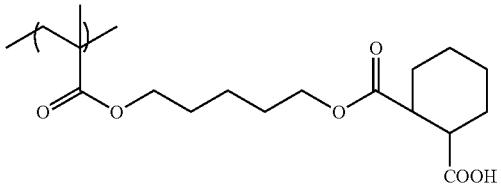
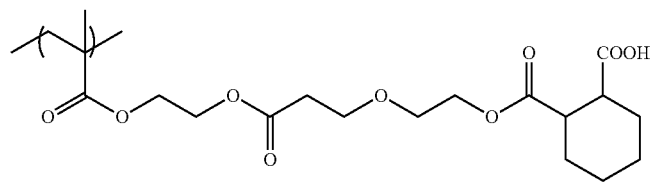
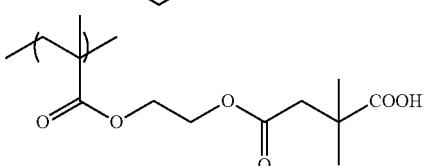
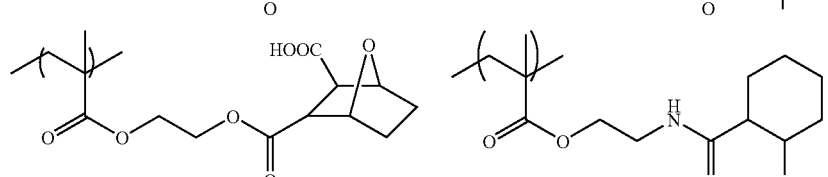
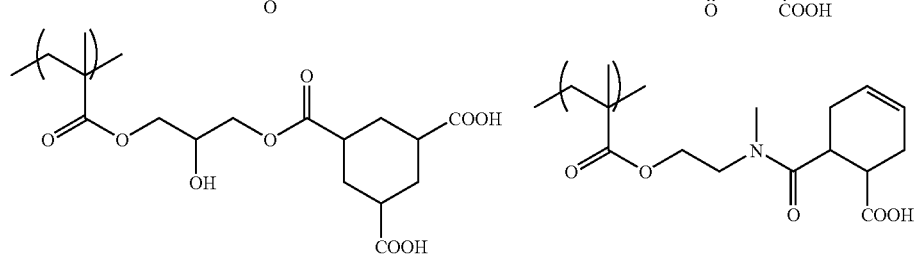
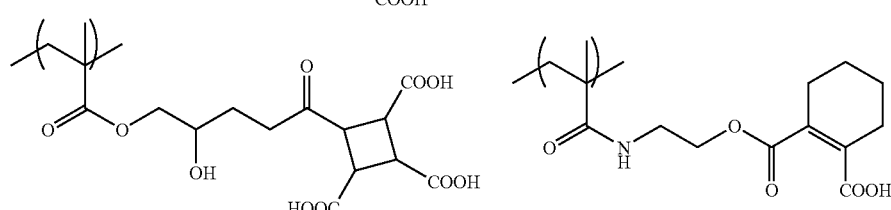
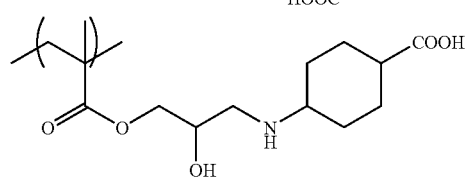
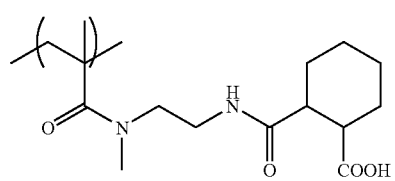
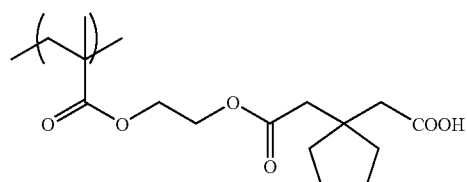
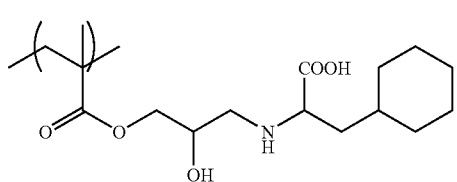
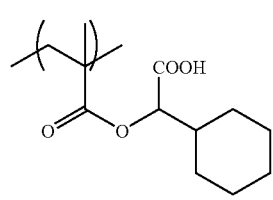
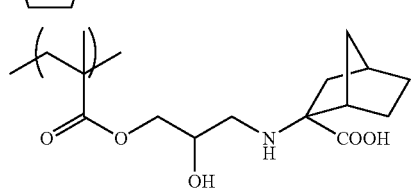
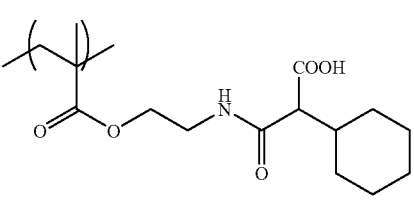

-continued
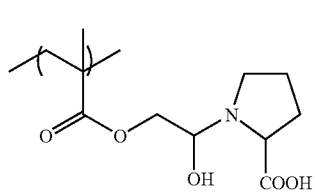 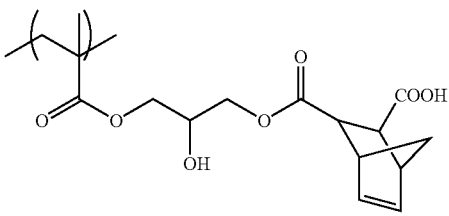
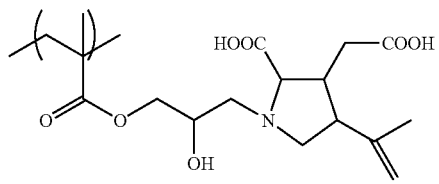 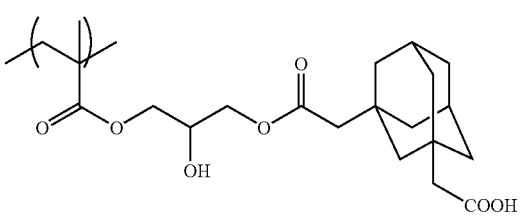
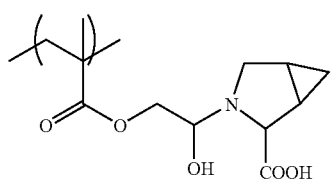 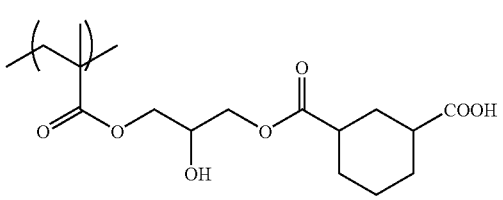
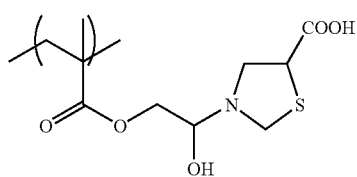 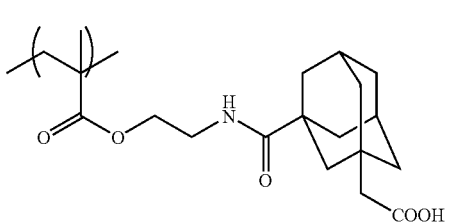
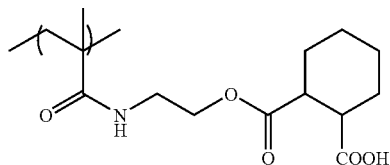 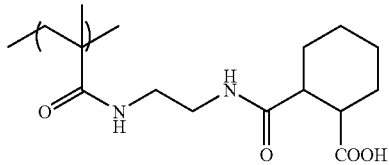
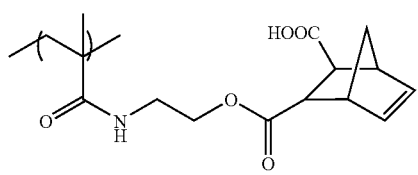 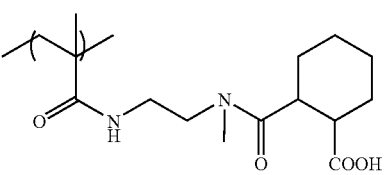
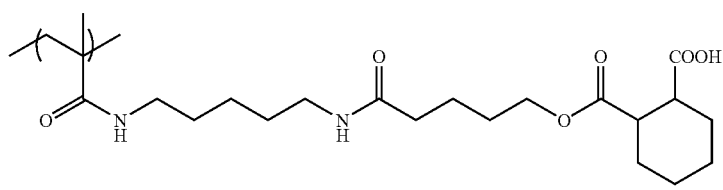
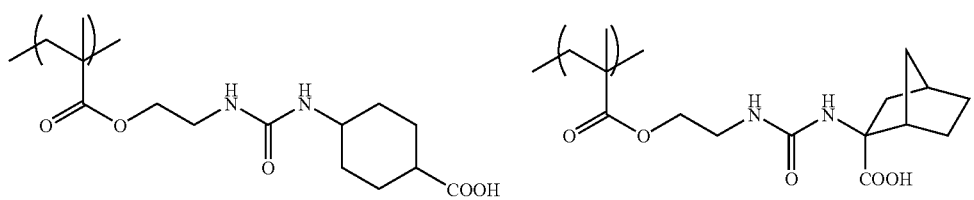

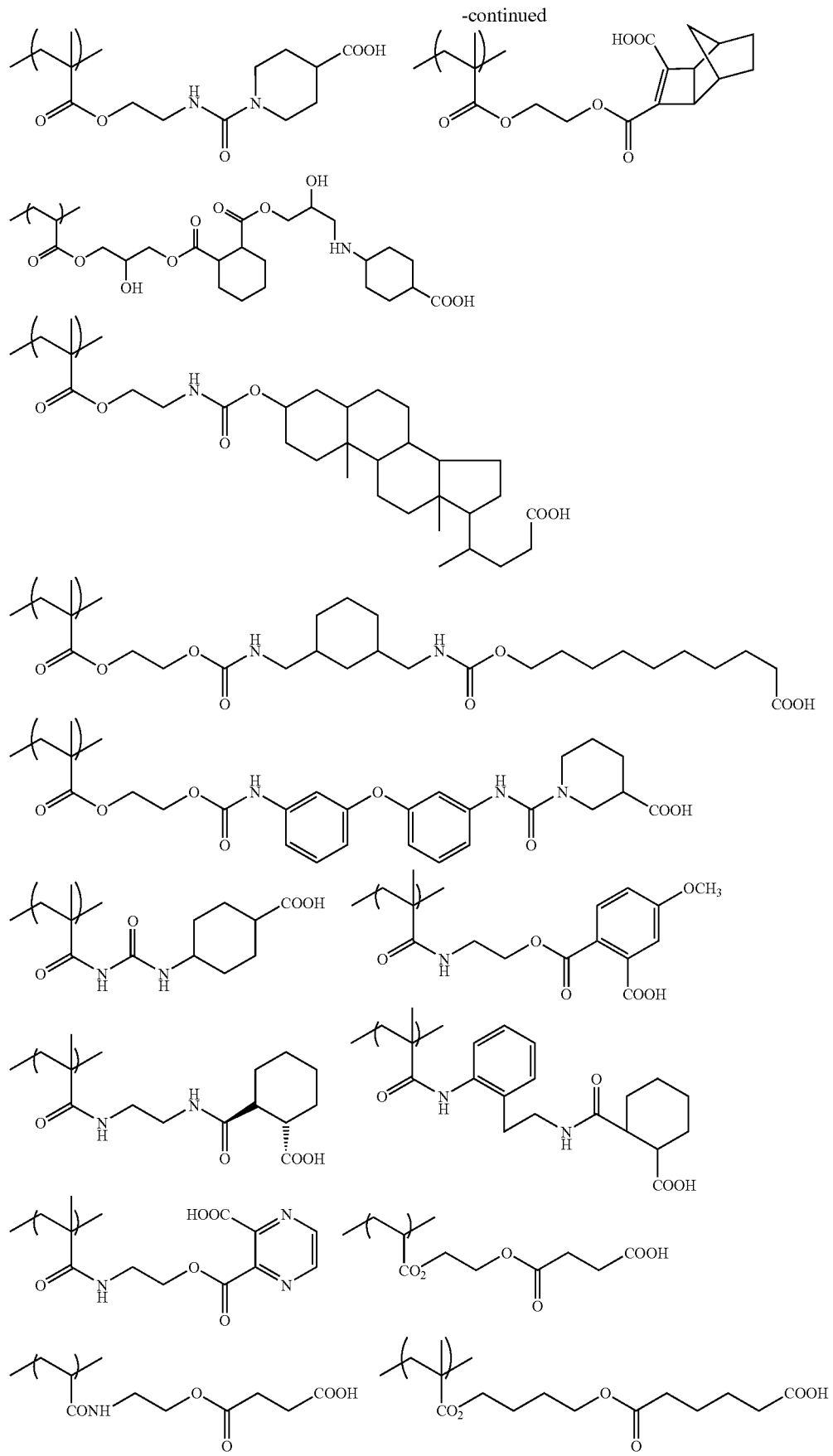

-continued

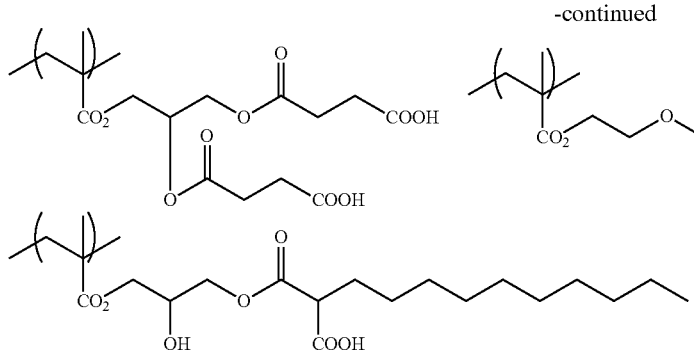

The binder polymer may have one or more repeating units represented by formula (i). The specific binder polymer used in the invention may be a polymer consisting of the repeating unit represented by formula (i), but is usually used as a copolymer in combination with any other copolymerizable component. A desired total content of the repeating unit represented by formula (i) in the copolymer is suitably determined from a desired structure of the polymer, and a desired composition for a recording layer, but the total content is preferably in the range of 1 to 99 mole %, more preferably 5 to 40 mole %, and still more preferably 5 to 20 mole % relative to the total mole of the polymer components.

When the binder polymer is a copolymer, the copolymerizable component to be used may be any conventionally known monomer that is a radically polymerizable monomer. Specific examples include monomers described in "Kobunshi Data Handbook (Polymer Data Handbook), Kiso-hen (Fundamental Step) edited by Kobunshi Gakkai (Society of Polymer Science, Japan), published by BAIFUKAN CO., LTD in 1986)". One of the copolymerizable components may be used or two or more of them can be used together.

A desired molecular weight of the specific binder polymer used in the invention is determined suitably, considering the image-forming property and printing durability of the precursor. The molecular weight is preferably in the range of 2,000 to 1,000,000, more preferably in the range of 5,000 to 500,000, and still more preferably in the range of 10,000 to 200,000.

The binder polymer used in the invention may be the specific binder polymer alone, or may be a mixture of the specific binder polymer with one or more other binder polymers. The combined binder polymer is used in a content of 1 to 60% by mass, preferably 1 to 40% by mass, and still more preferably 1 to 20% by mass with respect to the total mass of the binder polymer component. The combined binder polymer may be freely selected from known binder polymers, and specific examples thereof include acryl main chain binders and urethane binders.

The total amount of the specific binder polymer and the binder polymer which can be used in combination in the recording layer composition may be appropriately determined, but the total content is usually in the range of 10 to 90% by mass, preferably 20 to 80% by mass, and still more preferably 30 to 70% by mass relative to the total mass of the non-volatile components in the recording layer composition.

In addition, the acid value (meg/g) of the binder polymer is preferably in the range of 2.00 to 3.60.

Other Binder Polymers Usable Together with Specific Binder Polymer

Use of a binder polymer containing at least one radically polymerizable group as other binder polymer for use in combination with the specific binder polymer is also preferable.

The radically polymerizable group is not particularly limited, as long as it is radically polymerized. Examples thereof include α-substituted-methylacrylic groups (—OC(=O)—C(—CH$_2$Z)=CH$_2$ wherein Z is a hydrocarbon group with a hetero atom bonding to —CH$_2$ group), acrylic groups, methacrylic groups, allyl groups, and styryl groups. The radically polymerizable group is preferably an acrylic group or a methacrylic group.

The content of the radically polymerizable group(s) in the binder polymer, more specifically, the content of the radically polymerizable unsaturated double bonds determined by iodimetry, is preferably 0.1 to 10.0 mmol, more preferably 1.0 to 7.0 mmol, and most preferably 2.0 to 5.5 mmol per gram of the binder polymer, from the viewpoints of sensitivity and storage stability.

In addition, it is preferable that other binder polymer further has at least one alkali-soluble group. The content of the alkali-soluble group(s) in the binder polymer, in other words, the acid value of the binder polymer determined by neutralization titration, is preferably 0.1 to 3.0 mmol, more preferably 0.2 to 2.0 mmol, and most preferably 0.45 to 1.0 mmol per gram of the binder polymer, from the viewpoints of precipitation of development scums and printing durability.

The weight-average molecular weight of the binder polymer is preferably in the range of 2,000 to 1,000,000, more preferably in the range of 10,000 to 300,000, and most preferably in the range of 20,000 to 200,000, from the viewpoints of the film-forming property (printing durability) of the binder polymer and the solubility of the binder polymer in a coating solvent.

Further, the glass transition temperature (Tg) of the binder polymer is preferably in the range of 70 to 300° C., more preferably in the range of 80 to 250° C., and most preferably in the range of 90 to 200° C., from the viewpoints of storage stability, printing durability, and sensitivity.

The binder polymer preferably has an amide or imide group in the molecule thereof, and more preferably has a methacrylamide or a methacrylamide derivative, in order to raise the glass transition temperature of the binder polymer.

Other Components

The recording layer in the invention may contain not only the aforementioned essential components but also any other component which is suitable for the intended use, and the production method, if necessary. Preferred additives will be described below.

—Colorant—

A dye or pigment may be contained in the recording layer in the invention to color the layer. It is thus possible to improve so-called plate-checking properties such as the visibility of printing plates after plate-making and the applicability for image densitometer. Typical examples of the colorants include pigments such as phthalocyanine pigments, azo pigments, carbon black, and titanium oxide and dyes such as ethyl violet, crystal violet, azo dyes, anthraquinone dyes, cyanine dyes; and among them, cationic dyes are preferable.

The content of the colorant (dye or pigment) added is preferably approximately 0.5 to 5 mass % relative to the total amount of nonvolatile components in the entire recording layer composition.

—Polymerization Inhibitor—

It is preferable that the recording layer in the invention contains a small amount of a thermal polymerization inhibitor in order to inhibit undesired thermal polymerization of the compound having at least one polymerizable ethylenically unsaturated double bond, namely the polymerizable compound. Examples of the thermal polymerization inhibitor include hydroquinone, p-methoxyphenol, di-t-butyl-p-cresol, pyrogallol, t-butylcatechol, benzoquinone, 4,4'-thio-bis(3-methyl-6-t-butylphenol), 2,2'-methylenebis(4-methyl-6-t-butylphenol), and a primary cerium salt of N-nitrosophenylhydroxylamine. The content of the thermal polymerization inhibitor added is preferably about 0.01 to about 5% by mass relative to the total mass of the nonvolatile components contained in the recording layer composition. In order to prevent oxygen from inhibiting the polymerization, the recording layer composition may also contain a higher fatty acid derivative such as behenic acid or behenic acid amide, which is made to exist mainly at the surface of the layer during drying of the applied coating, if necessary. The content of the higher fatty acid derivative added is preferably about 0.5 to about 10% by mass relative to the mass of the nonvolatile components contained in the recording layer composition.

—Other Additives—

In addition, the recording layer in the invention may contain any other known additives such as an inorganic filler for improving the physical properties of a cured film, a plasticizer, and a sensitizing agent for improving a surface property of the recording layer by which an ink easily adheres to the layer surface. Examples of the plasticizer include dioctyl phthalate, didodecyl phthalate, triethylene glycol dicaprylate, dimethyl glycol phthalate, tricresyl phosphate, dioctyl adipate, dibutyl sebacate, and triacetylglycerin. The content of such a plasticizer is generally in the range of 10% by mass or less, relative to the total mass of the binder polymer(s) and the addition-polymerizable compound(s).

Further, the recording layer in the invention may contain a UV initiator, and/or a thermal crosslinking agent in order to enhance the effects of heating and exposure of the developed layer and in turn improve the film strength (printing durability) described hereinafter.

Support

Surface Treatment of Support

As the support used in the invention, a hydrophilized support is used as described hereinafter. The support is preferably paper, a polyester film, or an aluminum plate, and more preferably an aluminum plate, which is superior in dimensional stability and relatively cheap, and whose surface can be provided with superior hydrophilicity and strength by surface treatment as needed. In addition, the support is also preferably a composite sheet in which an aluminum sheet is laminated on a polyethylene terephthalate film, such as those disclosed in JP-B No. 48-18327.

The aluminum plate as particularly preferable support in the invention is a metal plate containing aluminum, which has dimensional stability, as the primary component thereof, and examples thereof include a pure aluminum plate, an alloy plate containing aluminum as the primary component and a trace amount of element(s) other than aluminum, and plastic films and paper on which aluminum or an aluminum alloy is laminated or vapor-deposited. A support made of aluminum or an aluminum alloy described above is called as an aluminum support hereinafter. Examples of elements other than aluminum that may be contained in the aluminum alloy include silicon, iron, manganese, copper, magnesium, chromium, zinc, bismuth, nickel, and titanium. The content of such an element or elements in the alloy is 10% by mass or less. The support in the invention is most preferably a pure aluminum support. However, it is difficult to prepare completely pure aluminum because of problems regarding a purifying process. Therefore, the aluminum plate may contain a trace amount of elements other than aluminum. As described above, the composition of the aluminum plate to be used in the invention is not particularly limited, and any of aluminum plates which are known and used in the art, for example, those satisfying requirements stipulated in JIS A1050, A1100, A3103, or A3005, may be appropriately used.

The thickness of the aluminum support for use in the invention is about 0.1 mm to about 0.6 mm. The thickness may be suitably changed according to the size of printing machine, the dimension of printing plate, and needs by users.

The surface of the aluminum support used in the invention may be subjected to treatment described hereinafter and be hydrophilized, if necessary.

Surface Roughening Treatment

The surface of the aluminum support may be roughened. Examples of a method for roughening a surface include mechanical surface roughening, chemical etching, and electrolytic graining disclosed in JP-A No. 56-28893; an electrochemical surface roughening method of electrochemically roughening a surface in a hydrochloric acid or nitric acid electrolyte; and a mechanical surface roughening method such as a wire brush graining method of scratching an aluminum surface with a metal wire, a ball graining method of roughening an aluminum surface with a polishing ball and an abrasive, and a brush graining method of roughening a surface with a nylon brush and an abrasive. One of these roughening methods or a combination of two or more of them can be conducted. The surface roughening method is preferably an electrochemical method of chemically roughening a surface in a hydrochloric or nitric acid electrolyte. The suitable amount of electric current is in the range of 50 to 400 C/dm$^2$, when the support serves as an anode. More specifically, alternate and/or direct current electrolysis is preferably carried out in an electrolyte having a hydrochloric or nitric acid content of 0.1 to 50% at a temperature in the range of 20 to 80° C. at an electric current density of 100 to 400 C/dm$^2$ for one second to 30 minutes.

The aluminum support whose surface has been roughened may be chemically etched in an acid or alkaline solution. Typical examples of an etching agent include sodium hydroxide, sodium carbonate, sodium aluminate, sodium metasilicate, sodium phosphate, potassium hydroxide, and lithium hydroxide. The concentration and the temperature of the etching agent are preferably 1 to 50%, and 20 to 100° C., respectively. In order to remove stains which remains on the etched surface (smuts), the support is washed with acid. Typical examples of the acid used include nitric acid, sulfuric acid, phosphoric acid, chromic acid, hydrofluoric acid, and borofluoric acid. A method for removing smuts on a surface electrochemically roughened is preferably a method described in JP-A No. 53-12739 in which a surface is brought into contact with 15 to 65% by mass of sulfuric acid at a temperature in the range of 50 to 90° C., and a method described in JP-B 48-28123 in which a surface is etched with alkali. The method and conditions are not particularly limited, as long as the surface roughness of the roughened surface Ra is about 0.2 to 0.5 µm.

Anodizing Treatment

The aluminum support which has been treated above and has an oxide layer thereon is then anodized.

In the anodizing treatment, one or more aqueous solutions of sulfuric acid, phosphoric acid, oxalic acid, and boric acid/sodium borate are used as the main component of an electrolytic solution. The electrolyte solution may contain other components commonly found in aluminum alloy plates, electrodes, tap water, and underground water. The electrolyte solution may also contain a second component and may further contain a third component. Examples of the second and third components include cations including ions of metals such as Na, K, Mg, Li, Ca, Ti, Al, V, Cr, Mn, Fe, Co, Ni, Cu, and Zn, and an ammonium ion; and anions such as nitrate, carbonate, chloride, phosphate, fluoride, sulfite, titanate, silicate, and borate ions. The concentration of the second and third components is preferably about 0 to 10,000 ppm. Although the conditions for the anodizing treatment are not particularly limited, the treatment is preferably performed by direct or alternating current electrolysis at a content of an acid commonly used as the main component of the electrolyte solution of 30 to 500 g/liter, at an electrolyte solution temperature of 10 to 70° C. and at an electric current density in the range of 0.1 to 40 A/m$^2$. The thickness of the resultant anodic oxidation film is in the range of 0.5 to 1.5 µm, and preferably in the range of 0.5 to 1.0 µm. The conditions for the treatment are preferably selected such that the anodic oxidation film formed on the treated support has micropores having a size of 5 to 10 nm and a pore density of $8 \times 10^{15}$ to $2 \times 10^{16}$ pores/m$^2$.

A treatment for imparting hydrophilicity to the surface of the support can be any of known methods. A treatment for imparting hydrophilicity with silicate or polyvinylphosphonic acid is particularly preferably conducted. The film is formed such that the amount of a silicon or phosphorus element is 2 to 40 mg/m$^2$, preferably 4 to 30 mg/m$^2$. The coated amount may be measured by a fluorescent X-ray analysis method.

The treatment for imparting hydrophilicity is performed, for example, by immersing the aluminum support having thereon an anodic oxidation film in an aqueous solution containing 1 to 30% by mass, preferably 2 to 15% by mass, of alkali metal silicate or polyvinylphosphonic acid, having, at 25° C., a pH of 10 to 13 and kept at a temperature in the range of 15 to 80° C. for 0.5 to 120 seconds.

The alkali metal silicate salt used in the hydrophilizing treatment can be sodium silicate, potassium silicate, and/or lithium silicate. Hydroxides are used to raise the pH of the solution of the alkali metal silicate salt, and examples thereof include sodium hydroxide, potassium hydroxide, and lithium hydroxide. An alkaline earth metal salt or a salt including a metal of Group IVB may be added to the treatment solution. Examples of the alkaline earth metal salt include water-soluble salts including nitrates such as calcium nitrate, strontium nitrate, magnesium nitrate, and barium nitrate, sulfates, hydrochlorides, phosphates, acetates, oxalates, and borates. Examples of the salt including a metal of Group IVB include titanium tetrachloride, titanium trichloride, titanium potassium fluoride, titanium potassium oxalate, titanium sulfate, titanium tetraiodide, zirconium oxychloride, zirconium dioxide, and zirconium tetrachloride.

One of the alkaline earth metal salts and the salts each including a metal of Group IVB may be used or two or more of them can be used together. The content of the metal salt is preferably 0.01 to 10% by mass, and more preferably 0.05 to 5.0% by mass. Moreover, silicate electrodeposition as described in U.S. Pat. No. 3,658,662 is also effective. Surface treatment in which a support electrolytically grained as disclosed in JP-B No. 46-27481, JP-A Nos. 52-58602 or 52-30503, and the anodizing treatment and the treatment for imparting hydrophilicity described above are combined with each other is also useful.

Rear Surface Treatment of Support

The planographic printing plate precursor of the invention is preferably subjected to the modification of the rear surface of the support for further improving the scratch resistance. When an aluminum support is used, examples of the method for modifying the rear surface of the support include a method of forming a uniformly anodized film on the rear surface of an aluminum support in the same manner as the recording layer side, and a method of forming a back coat layer. In the case where an anodized film is formed, the amount of the film is preferably 0.6 g/m$^2$ or more, and more preferably 0.7 to 6 g/m$^2$. Among them, a method of providing a back coat layer is more effective and preferable. These rear surface treatment methods are described below.

1. Formation of Rear Surface Anodized Film

First, a method of forming a uniformly anodized film on the rear surface of an aluminum support in the same manner as the recording layer side is described. The anodized film is formed by the same means as that used for the surface treatment of the support. The thickness of the anodized film provided on the rear surface of the support is preferably 0.6 g/m$^2$ or more, and is not particularly limited as to the upper limit from the viewpoint of performance. However, in consideration of energy such as electric power and time required for forming the film, the upper limit is about 6 g/m$^2$. The coating amount is preferably 0.7 g to 6 g/m$^2$, and more preferably 1.0 g to 3 g/m$^2$ from the practical viewpoint.

The amount of the anodized film may be determined by measuring the peak of $Al_2O_3$ using fluorescent X-ray, and converting the peak height into the coating amount on the basis of the calibration curve.

In the invention, whether an anodized film is provided on the entire surface of the aluminum support side in an amount of 0.6 g/m$^2$ or more is confirmed by the fact that the coating amount of the anodized film on the surface of the aluminum support of the planographic printing plate precursor which surface is opposite to the recording layer side is 0.6 g/m$^2$ or more at the center of the film and at portions that is 5 cm off from both ends on the plane which passes through the center and is orthogonal to the machine direction of the planographic printing plate precursor.

2. Formation of Back Coat Layer

Next, a method for providing a back coat layer on the rear surface of the aluminum support is described. The back coat layer in the invention may have any composition. Preferable examples of the back coat layer include a back coat layer containing a metal oxide prepared through hydrolysis and polycondensation of the below-described organic metal compound or inorganic metal compound, and colloidal silica sol, and a back coat layer composed of an organic resin film.

2-1. Back Coat Layer Containing Metal Oxide and Colloidal Silica Sol

A preferable first aspect of the back coat layer in the invention is a back coat layer containing a metal oxide and colloidal silica sol.

More specifically, the back coat layer is more preferably formed from a so-called sol-gel reaction liquid, in which an organic or inorganic metal compound is hydrolyzed or polycondensed in water and an organic solvent in the presence of a catalyst such as an acid or alkali.

Examples of the organic or inorganic metal compound used to form the back coat layer include metal alkoxides, metal acetylacetonates, metal acetates, metal oxalates, metal nitrates, metal sulfates, metal carbonates, metal oxychlorides, metal chlorides, and condensates thereof prepared through partial hydrolysis and oligomerization.

A metal alkoxide is represented by formula $M(OR)_n$ (wherein M represents a metal element, R represents an alkyl group, and n represents the oxidation number of the metal element). Specific examples thereof include $Si(OCH_3)_4$, $Si(OC_2H_5)_4$, $Si(OC_3H_7)$, $Si(OC_4H_9)_4$, $Al(OCH_3)_3$, $Al(OC_2H_5)_3$, $Al(OC_3H_7)_3$, $Al(OC_4H_9)_3$, $B(OCH_3)_3$, $B(OC_2H_5)_3$, $B(OC_3H_7)_3$, $B(OC_4H_9)_3$, $Ti(OCH_3)_4$, $Ti(OC_2H_5)_4$, $Ti(OC_3H_7)_4$, $Ti(OC_4H_9)_4$, $Zr(OCH_3)_4$, $Zr(OC_2H_5)_4$, $Zr(OC_3H_7)_4$, and $Zr(OC_4H_9)_4$, and other examples include alkoxides of Ge, Li, Na, Fe, Ga, Mg, P, Sb, Sn, Ta, and V, and monosubstituted silicon alkoxides of $CH_3Si(OCH_3)_3$, $C_2H_5Si(OCH_3)_3$, $CH_3Si(OC_2H_5)_3$, and $C_2H_5Si(OC_2H_5)_3$.

One of these organic or inorganic metal compounds may be used alone, or two or more of them can be used together. Among these organic or inorganic metal compounds, metal alkoxides are preferable because they are highly reactive and readily form polymers having metal-oxygen bonds. Among them, alkoxide compounds of silicon such as $Si(OCH_3)_4$, $Si(OC_2H_5)_4$, $Si(OC_3H_7)$, and $Si(OC_4H_9)_4$ are particularly preferable because they are inexpensive and readily available, and forms a excellent coating layer of a metal oxide. Also preferable are oligomers prepared through partially hydrolyzing and condensing these silicon alkoxide compounds. Examples thereof include ethyl silicate oligomers (average pentamer) containing about 40% by mass of $SiO_2$.

Other preferable examples include a combination of a metal alkoxide and a so-called silane coupling agent in which one or two alkoxy groups of the above-described silicon tetraalkoxy compound has been substituted with an alkyl group or a group having reactivity. Examples of the silane coupling agent added to the back coat layer in the invention include silane coupling agents in which one or two alkoxy groups of the above-described silicon tetraalkoxy compound has been substituted with a hydrophobic substituent such as a long-chain alkyl group having 4 to 20 carbon atoms or fluorine-substituted alkyl group. Among them, silane coupling agents having a fluorine-substituted alkyl group is particularly preferable. Specific examples of the silane coupling agent include $CF_3CH_2CH_2Si(OCH_3)_3$, $CF_3CF_2CH_2CH_2Si(OCH_3)_3$, and $CF_3CH_2CH_2Si(OC_2H_5)_3$, and commercial products such as LS-1090 (manufactured by Shin-Etsu Chemical Co., Ltd.). The above-described silane coupling agents substituted with a fluorine-substituted alkyl group are included in the scope of the organic fluorine compounds in the invention. The content of the silane coupling agent(s) is preferably 5 to 90% by mass, and more preferably 10 to 80% by mass with respect to the total solid content of the back coat layer.

The catalyst useful for forming the sol-gel coating liquid for the back coat layer is an organic or inorganic acid or alkali. Specific examples thereof include inorganic acids such as hydrochloric acid, sulfuric acid, sulfurous acid, nitric acid, nitrous acid, hydrogen fluoride, phosphoric acid, and phosphorous acid, organic acids such as formic acid, acetic acid, propionic acid, butyric acid, glycolic acid, chloroacetic acid, dichloroacetic acid, trichloroacetic acid, fluoroacetic acid, bromoacetic acid, methoxyacetic acid, oxaloacetic acid, citric acid, oxalic acid, succinic acid, malic acid, tartaric acid, fumaric acid, maleic acid, malonic acid, ascorbic acid, benzoic acid, substituted benzoic acid such as 3,4-dimethoxybenzoic acid, phenoxyacetic acid, phthalic acid, picric acid, nicotinic acid, picolinic acid, pyrazine, pyrazole, dipicolinic acid, adipic acid, p-toluic acid, terephthalic acid, 1,4-cyclohexene-2,2-dicarboxylic acid, erucic acid, lauric acid, and n-undecanoic acid, and alkalis such as hydroxides of alkali metals and alkaline earth metals, ammonia, ethanolamine, diethanolamine, and triethanolamine.

Other preferable examples of the catalyst include organic acids such as sulfonic acids, sulfinic acids, alkyl sulfuric acids, phosphonic acids, and phosphates, and specific examples thereof include p-toluenesulfonic acid, dodecylbenzenesulfonic acid, p-toluenesulfinic acid, ethyl acid, phenylphosphonic acid, phenylphosphine acid, phenyl phosphate, and diphenyl phosphate.

One of these catalysts may be used alone or two or more of them may be used together. The amount of the catalyst(s) is preferably 0.001 to 10% by mass, and more preferably 0.05 to 5% by mass with respect to the metal compound serving as a raw material. If the amount of the catalyst is below the range, the initiation of the sol-gel reaction is retarded. If the amount exceeds the range, the reaction rapidly proceeds to form non-uniform sol-gel particles, which results in a readily peelable coating layer.

The initiation of the sol-gel reaction requires an adequate amount of water. The addition amount of water is preferably 0.05- to 50-fold mol, and more preferably 0.5- to 30-fold mol with respect to the amount of water necessary for complete hydrolysis of the metal compound. If the amount of water is below the range, hydrolysis proceeds sluggishly. If the amount exceeds the range, the reaction proceeds sluggishly too, probably due to the ingredients being excessively diluted.

A solvent is further contained in the sol-gel reaction liquid. The solvent dissolves the metal compound serving as a raw material, and dissolves or disperses the sol-gel particles formed by the reaction. Examples of the solvent include lower alcohols such as methanol, ethanol, propanol, and butanol, and ketones such as acetone, methyl ethyl ketone, and diethyl ketone. In addition, in order to improve the properties of the coated surface of the back coat layer, mono or dialkyl ethers and acetates of glycols such as ethylene glycol, diethylene glycol, triethylene glycol, propylene glycol and dipropylene glycol may be added to the system. Among these solvents, water-miscible lower alcohols are preferable. The sol-gel reaction liquid is prepared using a solvent to have a concentration suitable to application. However, if the whole amount of the solvent is added to the reaction liquid at the outset, the hydrolysis reaction proceeds sluggishly probably due to excessive dilution of the ingredients. It is thus preferable that a portion of the solvent be added to the sol-gel reaction liquid, and the remainder of the solvent be added after the progress of the reaction.

The coating amount of the thus formed back coat layer containing a metal oxide and colloidal silica sol is preferably 0.01 to 3.0 g/m², and more preferably 0.03 to 1.0 g/m².

2-2. Back Coat Layer Composed of Organic Resin Film

Other preferable example of the back coat layer in the invention include a back coat layer composed of an organic resin film formed on the rear surface of the support.

In the present aspect, preferable examples of the resin capable of forming the back coat layer include thermosetting resins such as urea resins, epoxy resins, phenolic resins, melamine resins, and diallyl phthalate resins. Among them, from the viewpoint of forming a layer having a high physical strength, phenolic resins are preferable. Specific examples thereof include novolac resins and pyrogallol acetone resins such as a phenol formaldehyde resin, a m-cresol formaldehyde resin, a p-cresol formaldehyde resin, a m-/p-mixed cresol formaldehyde resin, a mixed phenol/cresol (m-, p-, or m-/p-mixed) formaldehyde resin.

Examples of the phenolic resin include condensation polymers of phenol having at least one alkyl group having 3 to 8 carbon atoms as the substituent and formaldehyde such as a t-butylphenol formaldehyde resin and an octylphenol formaldehyde resin as described in U.S. Pat. No. 4,123,279.

The weight-average molecular weight of the phenolic resin is preferably 500 or more, and more preferably 1,000 to 700,000 from the viewpoint of image forming ability. The number-average molecular weight of the resin is preferably 500 or more, and more preferably 750 to 650,000. The degree of dispersion (weight-average molecular weight/number-average molecular weight) of the resin is preferably 1.1 to 10.

One of these phenolic resins may be used alone or two or more of them can be used together. They may be combined with a condensation polymer of phenol having at least one alkyl group having 3 to 8 carbon atoms as the substituent and formaldehyde as described in U.S. Pat. No. 4,123,279, such as a condensation polymer of t-butylphenol and formaldehyde, or a condensation polymer of octylphenol and formaldehyde, or an organic resin having a phenol structure containing at least one electron-withdrawing group on an aromatic ring as described in JP-A No. 2000-241972, which was filed by the inventors.

The back coat layer in the invention may contain a surfactant for the purpose of improving the properties of the coated surface and controlling the physical properties of the surface. Examples of the surfactant include anionic surfactants having any one of carboxylate, sulfonate, sulfate, and phosphate; cationic surfactants such as aliphatic amines, quaternary ammonium salts; betaine-type amphoteric surfactants; nonionic surfactants such as fatty acid esters of polyoxy compounds, polyalkylene oxide condensates, and polyethylene imine condensates; and fluorinated surfactants. Among them, fluorinated surfactants are particularly preferable.

The addition amount of the surfactant(s) is appropriately selected according to the desired use, and usually in the range of 0.1 to 10.0% by mass of the back coat layer.

The fluorinated surfactant particularly preferably has, within the molecule thereof, a perfluoroalkyl group. Such a fluorinated surfactant is further described in detail below.

Examples of the fluorinated surfactant particularly preferably used in the back coat layer include anionic surfactants such as perfluoroalkyl carboxylates, perfluoroalkyl sulfonates, perfluoroalkyl phosphates, amphoteric surfactants such as perfluoroalkyl betaine, cationic surfactants such as perfluoroalkyl trimethyl ammonium salts, and nonionic surfactants such as perfluoroalkylamine oxide, perfluoroalkyl ethylene oxide adducts, oligomers containing a perfluoroalkyl group and a hydrophilic group, oligomers containing a perfluoroalkyl group and a lipophilic group, oligomers containing a perfluoroalkyl group, a hydrophilic group, and a lipophilic group, and urethanes containing a perfluoroalkyl group and a lipophilic group. In these surfactants, the fluoroaliphatic group is preferably a group represented by formula (1).

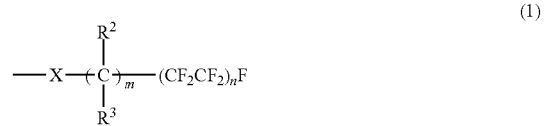

In formula (1), $R^2$ and $R^3$ each independently represent a hydrogen atom or an alkyl group having 1 to 4 carbon atoms, X represents a single bond or a divalent linking group selected from an alkylene group or an arylene group, m represents an integer of 0 or more, and n represents an integer of 1 or more.

In the case where X represents a divalent linking group, the linking group such as an alkylene group or an arylene group may be substituted, or contain in the structure thereof a linking group such as an ether group, an ester group, or an amide group. Examples of the substituent which may be introduced into the alkylene group or arylene group include a halogen atom, a hydroxy group, a mercapto group, a carboxyl group, an epoxy group, an alkyl group, and an aryl group, which may be further substituted. Among them, X is preferably an alkylene group, an arylene group, or an alkylene group having a linking group such as an ether group, an ester group, or an amide group, more preferably an unsubstituted alkylene group, an unsubstituted arylene group, or an alkylene group having therein an ether group or an ester group, and most preferably an unsubstituted alkylene group or an alkylene group having therein an ether group or an ester group.

It is preferable that such a fluorinated surfactant be contained in the back coat layer in a content of about 0.5 to 10% by mass.

Various methods are applicable to the application of the back coat layer composed of an organic resin film to the rear surface of an aluminum support. For example, a coating liquid is prepared by dissolving or emulsion-dispersing the back coat layer components, specifically ingredients composed mainly of an organic resin which optionally contain a silica gel or other fine particles, in an appropriate solvent, and the coating liquid is applied to the rear surface of the support, and dried. Alternatively, an organic resin film, which has been made into a film, is bonded to an aluminum support via an adhesive or by heating, or a molten film is formed with a melt extruder, and bonded to a support. Among them, the method of applying and drying a coating liquid is most preferable from the viewpoint of easy control of the coating amount. Examples of the solvent include organic solvents as described in JP-A No. 62-251739, which are used alone or as a mixture.

Examples of a device for applying a back coat layer coating liquid to a support surface include a bar coater, a roll coater, a gravure coater, and known metering and coating devices such as a curtain coater, an extruder, and a slide hopper. Among them, non-contact metering coaters such as a curtain coater, an extruder, and a slide hopper are particularly preferable because they will not give scratches on the rear surface of the aluminum support.

The thickness of the back coat layer in the invention which is a back coat layer containing a metal oxide and colloidal silica sol or a back coat layer composed of an organic resin is preferably in the range of 0.1 to 8 μm. When the thickness is within the range, the rear surface of the aluminum support has an improved surface lubricity, and a variation in the thickness of the back coat layer due to dissolution or swelling of the layer by chemicals during or in printing is suppressed, which also suppresses deterioration in printing property due to a variation in printing pressure.

Among the above-described back coat layers, the back coat layer composed of an organic resin is most preferable.

Preparation of Planographic Printing Plate Precursor

The planographic printing plate precursor of the invention has a recording layer and a protective layer on a support in that order and may have an undercoat layer, if necessary. The planographic printing plate precursor is prepared by dissolving the above-described components in a suitable solvent and sequentially applying the resulting coating liquids to a support.

The recording layer is formed by dissolving the above-described components of a recording layer in an organic solvent and applying the resultant recording layer coating liquid to a support or an undercoat layer.

Examples of the solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether acetate, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. One of these solvents may be used or two or more of them can be used together. The concentration of solid matters in the coating liquid for recording layer is preferably 2 to 50% by mass.

The coating amount of the recording layer can mainly influence on the sensitivity and the developing property of the recording layer, and the strength and the printing durability of an exposed layer, and therefore, is preferably selected according to applications of the precursors. When the coating amount is too small, printing durability becomes insufficient. On the contrary, when it is too large, sensitivity decreases, and consequently exposure of such a precursor requires much time, and development of the exposed plate needs longer time, and therefore, it is not desirable. For the planographic printing plate precursor for scanning and exposure, the coating amount of the recording layer is preferably in the range of about 0.1 to about 10 g/m$^2$, and more preferably in the range of 0.5 to 5 g/m$^2$ based on the dry mass.

Intermediate Layer (Undercoat Layer)

The planographic printing plate precursor of the invention may have an intermediate layer (also referred to as an undercoat layer) for the purpose of improving adhesiveness between the recording layer and the support and the staining property of the precursor. Specific examples of such an intermediate layer include those described in JP-B No. 50-7481, JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682, 11-84674, 11-38635, 11-38629, 10-282645, 10-301262, 11-24277, 11-109641, 10-319600, 11-84674, 11-327152, 2000-10292, 2000-235254, 2000-352854, and 2001-209170, and Japanese Patent Application No. 11-284091.

Plate-Making Method

Hereinafter, a method of making the planographic printing plate according to the invention will be described in detail.

The planographic printing plate according to the invention described above is produced by placing a pile of planographic printing plate precursors prepared by piling multiple precursors, with a protective layer of one precursor brought into contact with the rear surface of an aluminum support of adjacent precursor, in a plate setter, conveying each of the planographic printing plate precursors automatically, exposing the precursor to light having a wavelength of 750 to 1,400 nm, and developing the precursor under the condition of a conveyance speed of 1.25 m/min or more without conducting substantial heat treatment.

The planographic printing plate precursor according to the invention described above can be applied to the plate-making method described above, because adhesiveness between planographic printing plate precursors and generation of scratch on the protective layer are controlled even when they are piled without inserting a laminated paper between the precursors.

The method of making the planographic printing plate according to the invention, which uses a pile of planographic printing plate precursors without laminated paper, eliminates removal of the laminated paper and improves productivity in the plate-making process.

The plate-making method is not only preferable for the planographic printing plate precursor according to the invention, but may also be applied preferably to a planographic printing plate precursor having a polymerizable negative type recording layer that at least contains at least one infrared absorbent, at least one polymerization initiator, and at least one polymerizable compound and that becomes less soluble in alkaline developing solution by exposure to light having a wavelength of 750 to 1,400 nm. Specifically, the latter precursor has a recording layer containing respective components, the "infrared absorbent, polymerization initiator, and polymerizable compound" described above as the components of the recording layer of the planographic printing plate precursor according to the invention, and the layer may or may not contain a known binder polymer.

In addition, the recording layer to which the method of making the planographic printing plate according to the invention is applied preferably has physical properties of a developing speed of 80 nm/sec or more in an alkaline developing solution having pH of 10 to 13.5 in the unexposed area and a permeation speed of the alkaline developing solution into the exposed area of 50 nF/sec or less. The method described in Japanese Patent Application No. 2004-248535 filed by the applicant may be used for determining the developing speed of the recording layer in the unexposed area and the permeation speed of the alkaline developing solution into the recording layer after hardening. Any one of common methods may be used to control the developing speed of the recording layer in the unexposed area or the permeation speed of the alkaline developing solution into the recording layer after hardening, and typically, a method using the specific binder polymer described above is useful; inclusion of a hydrophilic compound in the recording layer is useful for improvement of the developing speed in the unexposed area, and inclusion of a hydrophobic compound in the recording layer is useful for control of penetration of the developing solution into the exposed area.

Exposure

The light source for use in the exposure in the invention is not particularly limited if it emits light having a wavelength of 750 nm to 1,400 nm. However, an infrared laser is preferable. Among infrared lasers, a solid-state or semiconductor laser emitting infrared light having a wavelength of 750 nm to 1,400 nm is preferable for imagewise exposure in the invention. The laser output is preferably 100 mW or more, and use of a multi-beam laser device is preferable to shorten exposure period. The exposure period per pixel is preferably 20μ seconds or less. The energy of the light irradiated onto the planographic printing plate precursor is preferably 10 to 300 mJ/cm². An excessively low light-exposure energy prohibits sufficient hardening of the recording layer. Alternatively, an excessively high light-exposure energy may result in laser ablation of the recording layer and thus in damage of the image.

In the invention, the exposure is executed such that light beams from a light source overlap. The phrase "light beams from a light source overlap" means that the pitch of sub-scanning is smaller than the diameter of each light beam. When the beam diameter is expressed by the half breadth of the beam intensity (FWHM), the degree of overlap can be quantitatively expressed by FWHM/sub-scanning pitch (overlap coefficient). In the invention, the overlap coefficient is preferably 0.1 or higher.

A scanning method of the light source in the exposure device for use in the invention is not particularly limited, and exposure may be performed either by scanning the external or internal wall of cylindrical printing plate precursor or the surface of flat printing plate precursor. The channel of the light source may be single channeled or multi channeled, but the multi-channeled light source is preferably used in the case of scanning the external surface of cylindrical precursor.

In the invention, as described above, the planographic printing plate precursor is supplied after exposure to the development step without conducting particular heat treatment or washing treatment. Absence of the heat treatment allows suppression of unevenness of images caused by the heat treatment. In addition, absence of the heating and washing treatments enables steady development at a high speed.

Development

The non-image region in the recording layer is removed by using a developing solution during development in the invention. In the invention, as described above, the processing speed during development, i.e., the conveyance speed (line speed) of the planographic printing plate during development, should be 1.25 m/min or more and is preferably 1.35 m/min or more. The upper limit of the conveyance speed is not particularly limited, but preferably 3 m/min or less from the viewpoint of stability of conveyance.

Hereinafter, the developing solution for use in the invention will be described below.

Developing Solution

The developing solution for use in the invention is preferably an aqueous alkaline solution having pH of 14 or lower and preferably contains at least one aromatic anionic surfactant.

Aromatic Anionic Surfactant

In the invention, the aromatic anionic surfactant for use in the developing solution is effective in accelerating development and dispersing and stabilizing the components of the polymerizable negative-type recording layer and the protective layer in the developing solution and is thus preferable for stabilization of development. In particular, the aromatic anionic surfactant for use in the invention is preferably a compound represented by the following Formula (A) or (B):

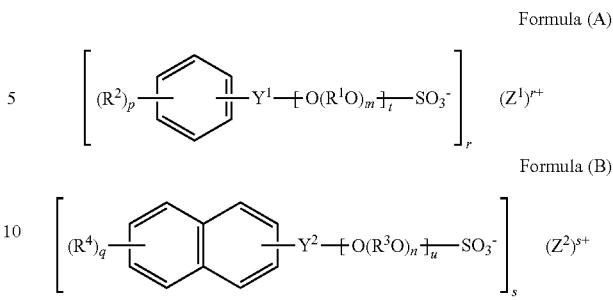

In formula (A) or (B), $R^1$ and $R^3$ each represent a linear or branched alkylene group having 1 to 5 carbon atoms, and specific examples thereof include an ethylene group, a propylene group, a butylene group, and a pentylene group. Each of $R^1$ and $R^3$ is particularly preferably an ethylene group or a propylene group.

m and n each are an integer of 1 to 100, and are preferably an integer of 1 to 30, and more preferably an integer of 2 to 20. When m is 2 or more, plural $R^1$ groups may be the same as or different from each other. Similarly, when n is 2 or more, plural $R^3$ groups may be the same as or different from each other.

t and u each are 0 or 1.

$R^2$ and $R^4$ each represent a linear or branched alkyl group having 1 to 20 carbon atoms, and specific examples thereof include a methyl group, an ethyl group, a propyl group, a butyl group, a hexyl group, and a dodecyl group. Each of $R^2$ and $R^4$ is particularly preferably a methyl group, an ethyl group, an iso-propyl group, a n-propyl group, a n-butyl group, an iso-butyl group, or a tert-butyl group.

p and q each represent an integer of 0 to 2. $Y^1$ and $Y^2$ each represent a single bond or an alkylene group having 1 to 10 carbon atoms. Each of $Y^1$ and $Y^2$ is preferably a single bond, a methylene group, or an ethylene group, and more preferably a single bond.

$(Z^1)^{r+}$ and $(Z^2)^{s+}$ each represent an alkali metal ion, an alkaline earth metal ion, or a unsubstituted or alkyl-substituted ammonium ion, and specific examples thereof include a lithium ion, a sodium ion, a potassium ion, a magnesium ion, a calcium ion, an ammonium ion, secondary to quaternary ammonium ions substituted with an alkyl group having 1 to 20 carbon atoms, an aryl group, and/or an aralkyl group. Each of $(Z^1)^{r+}$ and $(Z^2)^{s+}$ is particularly preferably a sodium ion. r and s each represent 1 or 2.

Specific examples of the compound are shown below, but the invention is not limited by them.

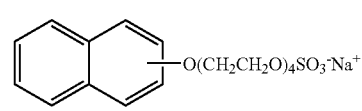

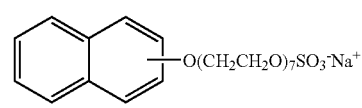

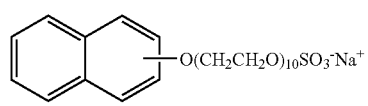

-continued

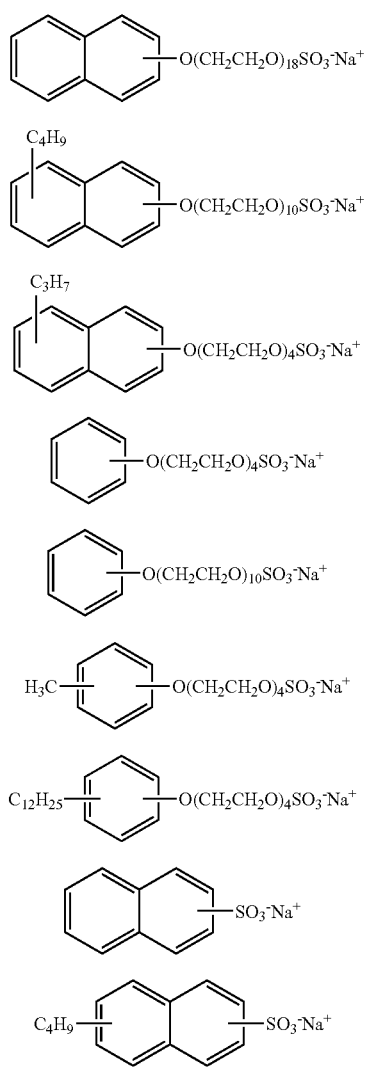

One of these aromatic anionic surfactants may be used or two or more of them can be used together. The concentration of the aromatic anionic surfactant(s) in the developing solution is preferably in the range of 1.0 to 10% by mass and more preferably in the range of 2 to 10% by mass. When the concentration is less than 1.0% by mass, the developing property and the solubility of the recording layer components deteriorate. When the concentration is more than 10% by mass, the printing durability of a printing plate deteriorates.

The developing solution used in the invention may also contain other surfactant(s) in addition to the aromatic anionic surfactant(s). Examples of other surfactants include nonionic surfactants including polyoxyethylene alkyl ethers such as polyoxyethylene naphthyl ether, polyoxyethylene alkyl phenyl ethers, polyoxyethylene lauryl ether, polyoxyethylene cetyl ether, and polyoxyethylene stearyl ether; polyoxyethylene alkyl esters such as polyoxyethylene stearate; sorbitan alkyl esters such as sorbitan monolaurate, sorbitan monostearate, sorbitan distearate, sorbitan monooleate, sorbitan sesquioleate, and sorbitan trioleate; and monoglyceride alkyl esters such as glycerol monostearate and glycerol monooleate.

The content of other surfactant(s) in the developing solution is preferably 0.1 to 10% by mass when calculated on the basis of active components.

Chelating Agent for Bivalent Metal

The developing solution used in the invention preferably contains a chelating agent for bivalent metal(s), for example, to suppress the adverse effects of the bivalent metals such as calcium ions contained in hard water. Examples of the chelating agent for bivalent metal(s) include polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate); amino-polycarboxylic acids such as ethylenediamine tetraacetic acid and potassium, sodium, and amine salts thereof, diethylenetriamine pentaacetic acid and potassium and sodium salts thereof, triethylenetetramine hexaacetic acid and potassium and sodium salts thereof, hydroxyethylethylenediamine triacetic acid and potassium and sodium salts thereof, nitrilotriacetic acid and potassium and sodium salts thereof, 1,2-diaminocyclohexane tetraacetic acid and potassium and sodium salts thereof, and 1,3-diamino-2-propanol tetraacetic acid and potassium and sodium salts thereof, and organic phosphonic acids such as 2-phosphonobutane tricarboxylic acid-1,2,4 and potassium and sodium salts thereof; 2-phosphonobutanone tricarboxylic acid-2,3,4 and potassium and sodium salts thereof, 1-phosphonoethane tricarboxylic acid-1,2,2 and potassium and sodium salts thereof, 1-hydroxyethane-1,1-diphosphonic acid and potassium and sodium salts thereof, and aminotri(methylenephosphonic acid) and potassium and sodium salts thereof. The chelating agent for bivalent metal(s) is preferably ethylenediamine tetraacetic acid or a potassium, sodium, or amine salt thereof, ethylenediamine tetra(methylenephosphonic acid) or an ammonium or potassium salt thereof, or hexamethylenediamine tetra(methylenephosphonic acid) or an ammonium or potassium salt thereof.

The optimum content of the chelating agent depends on the hardness and the amount of hard water used. However, the content in the developing solution is generally in the range of 0.01 to 5% by mass and preferably 0.01 to 0.5% by mass.

The developing solution used in the invention may contain an alkali metal salt of an organic acid and/or an alkali metal salt of an inorganic acid as a development adjusting agent. For example, one salt or two or more of salts selected from sodium carbonate, potassium carbonate, ammonium carbonate, sodium citrate, potassium citrate, and ammonium citrate may be contained in the developing solution.

Alkali Agent

Examples of the alkali agent contained in the developing solution used in the invention include inorganic alkali agents such as sodium tertiary phosphate, potassium tertiary phosphate, ammonium tertiary phosphate, sodium borate, potassium borate, ammonium borate, sodium hydroxide, potassium hydroxide, ammonium hydroxide, and lithium hydroxide; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. In the invention, one of these alkali agents may be used or two or more of them can be used together.

In addition, an alkali silicate may be included in the alkali agent. The alkali silicate may be used in combination with a base. The alkali silicate salt used is a salt that becomes alkaline when dissolved in water, and examples thereof include sodium silicate, potassium silicate, lithium silicate, and ammonium silicate. One of these alkali silicates may be used or two or more of them can be used together.

The developing solution for use in the invention can be optimally adjusted by controlling the mixing ratio and the concentrations of silicon oxide $SiO_2$, that is a component of the silicate salt used as a hydrophilizing component for a support, and an alkali oxide $M_2O$ (M represents an alkali metal or an ammonium group) used as an alkali component. The mixing ratio (molar ratio) of silicon oxide $SiO_2$ to alkali oxide $M_2O$ ($SiO_2/M_2O$) is preferably in the range of 0.75 to 4.0, and more preferably in the range of 0.75 to 3.5 for the purpose of suppressing stains caused by leaving a support for too long period of time in the developing solution and by excessively dissolving (etching) the anodic oxide film on the support in the solution, or suppressing generation of insoluble gas caused by forming a complex of the dissolved aluminum and silicate.

From the viewpoints of suppression of the dissolution (etching) of the anodic oxide film disposed on the support, a developing property, suppression of precipitation and crystal growth, and suppression of gelling of the alkali silicate caused by neutralization of wastewater, the concentration of the alkali silicate in the developing solution is such that the content of silicon dioxide in the developing solution is preferably in the range of 0.01 to 1 mol/L and more preferably in the range of 0.05 to 0.8 mol/L.

The developing solution used in the invention may further contain the following components in addition to the components described above, if necessary. Examples thereof include organic carboxylic acids such as benzoic acid, phthalic acid, p-ethylbenzoic acid, p-n-propylbenzoic acid, p-iso-propylbenzoic acid, p-n-butylbenzoic acid, p-t-butylbenzoic acid, p-2-hydroxyethylbenzoic acid, decanoic acid, salicyclic acid, and 3-hydroxy-2-naphthoic acid; organic solvents such as propylene glycol; and reducing agents, dyes, pigments, water softeners, and antiseptics.

The pH of the developing solution for use in the invention is preferably in the range of 10 to 12.5 and more preferably in the range of 11 to 12.5 at 25° C. Even when the developing solution used in the invention has such a low pH, the developing solution contains the surfactant described above, and therefore exhibits an excellent developing property with respect to the non-image portion of a plate. Adjusting the pH of the developing solution to a relatively low value can lessen damage on image portions during development and facilitate handling of the developing solution.

The electric conductivity x of the developing solution is preferably not less than 2 mS/cm and less than 30 mS/cm and more preferably 5 to 25 mS/cm.

It is preferable to add an alkali metal salt of an organic or inorganic acid to the developing solution as an agent for adjusting the electric conductivity of the developing solution.

The developing solution can be used as a developing solution or a replenishing development solution for the exposed planographic printing plate, and is preferably applied to automatic developing machines. When the plate is developed in an automatic developing machine, the developing solution becomes deteriorated as the processing amount increases. Therefore, the processing efficiency may be recovered by adding a replenishing solution or using a fresh developing solution. The replenishing system is preferably used in the plate-making method according to the invention.

Use of a replenishing method described in U.S. Pat. No. 4,882,246 is also preferable to recover the processing efficiency of the developing solution in automatic developing machine. Developing solutions described in JP-A Nos. 50-26601 and 8-54341 and JP-B Nos. 56-39464, 56-42860, and 57-7427 are also preferable.

The replenishing development solution used in the invention is more preferably an aqueous solution which contains an oxycarboxylate chelating agent forming a water-soluble chelate compound together with aluminum ions, an alkali metal hydroxide, a surfactant, and no silicate, and has a pH of 11 to 13.5. Use of such a replenishing development solution allows the achievement of excellent developing property without impairment of the strength of the image region on the plate material, effectively suppresses deposition of aluminum hydroxide formed by elution of the aluminum support by the alkalis in the developing solution, suppresses adhesion of stains composed mainly of aluminum hydroxide to the surface of the roller in the developer bath of the automatic developing machine, and reduces accumulation of aluminum hydroxide deposits in the subsequent water washing bath, thereby allowing stable treatment for a long period of time.

The planographic printing plate thus developed is then post-treated with a washing solution containing, for example, washing water and a surfactant, and with a desensitizing solution containing gum Arabic, and/or starch derivative, as described in JP-A Nos. 54-8002, 55-115045, and 59-58431. A combination of these treatments are used in the post-treatment of the planographic printing plate according to the invention.

In the method of making the planographic printing plate according to the invention, the entire surface of the image after development may be post-heated or exposed to light for the purpose of improving the image strength and printing durability.

A very severe conditions may be used during the heating after development. It is usually performed at a heating temperature in the range of 200 to 500° C. A low heating temperature after development may lead to insufficient improvement in image strength, while an excessively high temperature may lead to the problems of degradation of the support and thermal decomposition of the image region.

Subsequently, the planographic printing plate(s) obtained from the above procedure is (are) set in an offset printing machine and used to print images on a number of sheets of paper.

A plate cleaner is used to remove stains on the plate during printing, and is a conventionally known plate cleaner for PS plates. Examples thereof include CL-1, CL-2, CP, CN-4, CN, CG-1, PC-1, SR, and IC (manufactured by Fuji Film Co. Ltd.).

EXAMPLES

The invention is illustrated by following examples, however the invention is not limited to them.

Preparation of Aqueous Dispersion of Silica-Coated Fine Particles (1) Preparation of Aqueous Dispersion of OPTBEADS 6500M In order to improve the dispersion stability, 3.0 g of a nonionic surfactant (EMALEX 710 manufactured by Nippon Nyukazai Co., Ltd.) and 3.0 g of carboxymethyl cellulose (CELLOGEN PR manufactured by Dai-ichi Kogyo Seiyaku Co., Ltd.) were dissolved in 74 g of pure water. To the resultant aqueous solution, 20.0 g of fine particles of a silica composite crosslinked melamine resin (OPTBEADS 6500M manufactured by Nissan Chemical Industries, Ltd.) was added. The resultant was stirred at 10,000 rpm for 15 minutes using an ACE homogenizer (manufactured by Nippon Seiki Co., Ltd.) to obtain an aqueous dispersion of OPTBEADS 6500M.

(2) Preparation of Aqueous Dispersion of ARTPEARL J-7P

An aqueous dispersion of ARTPEARL J-7P was obtained in the same manner as in (1) Preparation of aqueous dispersion of OPTBEADS 6500M, except that 20.0 g of fine particles of a silica composite crosslinked acrylic resin (ARTPEARL J-7P manufactured by Negami Chemical Industrial Co., Ltd.) was used in place of OPTBEADS 6500M.

(3) Preparation of Aqueous Dispersion of ARTPEARL U-800T

An aqueous dispersion of ARTPEARL U-800T was obtained in the same manner as in (1) Preparation of aqueous dispersion of OPTBEADS 6500M, except that 20.0 g of fine particles of a silica composite crosslinked urethane resin (ARTPEARL U-800T manufactured by Negami Chemical Industrial Co., Ltd.) was used in place of OPTBEADS 6500M.

Example 1

Preparation of Support

A JIS-A1050 aluminum plate having a thickness of 0.30 mm and a width of 1,030 mm was surface-treated as follows:

Surface Treatment

The surface treatment was carried out by sequentially conducting the following steps (a) to (f). After each step and water washing, liquid remaining on the aluminum plate was removed with a nip roller.

(a) The aluminum plate was etched in a solution containing 26 weight % of sodium hydroxide and 6.5 weight % of aluminum ions at 70° C., until the amount of dissolved aluminum became 5 g/m². The etched plate was then washed with water.

(b) The aluminum plate was desmutted by spraying an aqueous solution including 1 weight % of nitric acid and 0.5 weight % of aluminum ions and kept at 30° C. to the plate. The aluminum plate was then washed with water.

(c) The surface of the aluminum plate was continuously electrochemically roughened by applying an alternate current voltage having a frequency of 60 Hz to the plate immersed in an electrolyte which was an aqueous solution including 1 weight % of nitric acid, 0.5 weight % of aluminum ions and 0.007 weight % of ammonium ions and kept at 30° C. The alternate current voltage had a trapezoidal waveform, a time (TP) which it took to increase an electric current value from zero to peak was 2 mseconds, and a duty ratio was 1:1. In the treatment, a carbon electrode was used as a counter electrode. A ferrite electrode was used as an auxiliary anode. The electric current density was 25 A/dm² at the peak of electric current. The total amount of electricity used in this treatment and used when the aluminum plate served as an anode was 250 C/cm². A part (5%) of the current supplied from a power source was applied to the auxiliary anode. The aluminum plate was then washed with water.

(d) The aluminum plate was etched by spraying a solution containing 26 weight % of sodium hydroxide and 6.5 weight % of aluminum ions to the plate at 35° C., until the amount of dissolved aluminum became 0.2 g/m². Thereby, smuts mainly containing aluminum hydroxide which had occurred during the electrochemical surface roughening by using the alternate current were removed, and the edge portions of pits generated were dissolved and smoothened. The aluminum plate was then washed with water.

(e) The aluminum plate was desmutted by spraying an aqueous solution containing 25 weight % of sulfuric acid and 0.5 weight % of aluminum ions and kept at 60° C. to the plate. Water was sprayed on the plate to wash the plate.

(f) The aluminum plate was anodized in an electrolyte containing sulfuric acid at a concentration 170 g/L and additionally containing aluminum ions at a concentration 0.5 weight % and kept at 33° C. at an electric current density of 5 A/dm² for 50 seconds. The aluminum plate was then washed with water. After the treatment, the amount of anodic oxide film was 2.7 g/m².

An aluminum support was thus obtained. The surface roughness Ra of the aluminum support was measured with an apparatus, SURFCOM manufactured by Tokyo Seimitsu Co. Ltd., having a stylus with a distal diameter of 2 μm, and found to be 0.27.

Undercoat Layer

Subsequently, the following undercoat layer coating liquid was applied to the aluminum support with a wire bar and the resultant coating was dried at 90° C. for 30 seconds. The coating amount was 10 mg/m².

| Undercoat layer coating liquid | |
|---|---|
| Polymer compound A having the following structure (weight-average molecular weight: 30,000) | 0.05 g |
| Methanol | 27 g |
| Deionized water | 3 g |

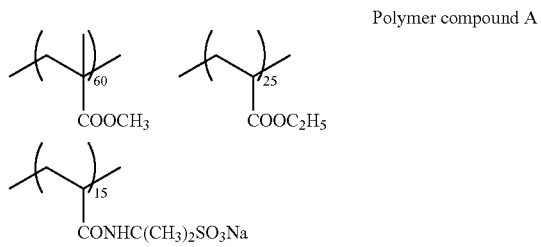

Polymer compound A (Formation of Recording Layer)

Subsequently, the following recording layer coating liquid [P-1] was prepared and applied to the aluminum support with a wire bar, and the resultant coating on the aluminum support was dried for 34 seconds at 115° C. in a hot air dryer. Thus, a planographic printing plate precursor was obtained. The dry coating amount of the recording layer was 1.4 g/m².

| <Recording layer coating liquid [P-1]> | |
|---|---|
| Infrared ray absorbent (IR-1) | 0.074 g |
| Polymerization initiator (OS-12) | 0.280 g |
| Additive (PM-1) | 0.151 g |
| Polymerizable compound (AM-1) | 1.00 g |
| Specific binder polymer (BT-1) | 1.00 g |
| Ethyl violet (C-1) | 0.04 g |
| Fluorinated surfactant (MEGAFAC F-780-F manufactured by Dainippon Ink and Chemicals, Inc., 30 wt % solution including isobutyl ketone) | 0.015 g |
| Methyl ethyl ketone | 10.4 g |
| Methanol | 4.83 g |
| 1-Methoxy-2-propanol | 10.4 g |

The polymerization initiator (OS-12) used in the above recording layer coating liquid is the same compound mentioned as an example of the onium salt compound represented by Formula (1). The structures of the infrared ray absorbent (IR-1), additive (PM-1), polymerizable compound (AM-1), binder polymer (BT-1), and ethyl violet (C-1) used in the recording layer coating liquid are shown below.

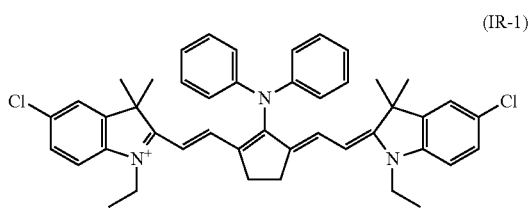 (IR-1)

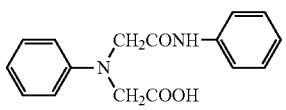 (PM-1)

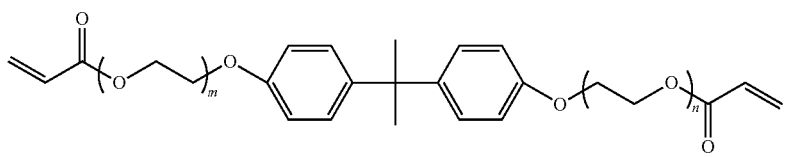 (AM-1)

$m + n \approx 4$

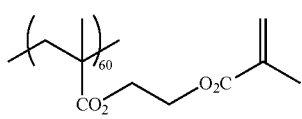 (BT-1)

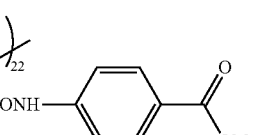

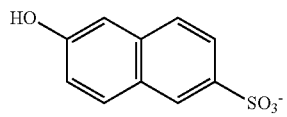 (C-1)

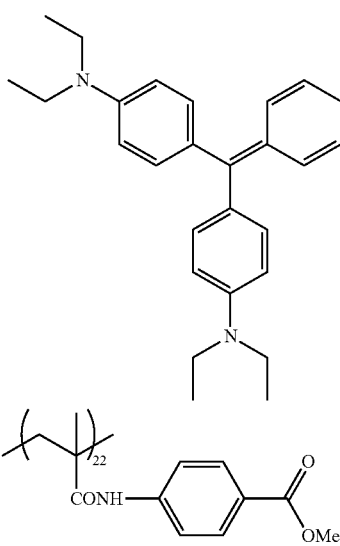

Formation of Protective Layer

The recording layer was formed as described above using the recording layer coating liquid [P-1], and the following protective layer coating liquid [1] was applied to the surface of the recording layer with a wire bar, and the resultant coating was dried for 75 seconds at 125° C. in a hot air drier to form a protective layer. Thus, a planographic printing plate precursor of Example 1 was obtained. The total coating amount (dry coating amount) of the protective layer was 1.6 g/m².

| <Protective layer coating liquid [1]> | |
|---|---|
| Synthetic mica (SOMASIF ME-100 manufactured by Co-op Chemical Co., Ltd., 8% aqueous dispersion) | 94 g |
| Polyvinyl alcohol (CKS-50: saponification degree of 99 mol %, degree of polymerization of 300, manufactured by Nippon Synthetic Chemical Industry Co., Ltd.) | 58 g |
| CELLOGEN PR manufactured by Dai-ichi Kogyo Seiyaku Co., Ltd. | 24 g |

-continued

| <Protective layer coating liquid [1]> | |
|---|---|
| Surfactant-1 (PLURONIC P-84 manufactured by BASF) | 2.5 g |
| Surfactant-2 (EMALEX 710 manufactured by Nihon-Emulsion Co., Ltd.) | 5 g |
| Aqueous dispersion of silica composite organic resin fine particles (aqueous dispersion of OPTBEADS 6500M) [obtained in (1) Preparation of aqueous dispersion of OPTBEADS 6500M] | 15 g |
| Pure water | 1364 g |

Examples 2 to 5

Planographic printing plate precursors of Examples 2 to 5 were obtained in the same manner as in Example 1, except that the kind of the silica-coated organic resin fine particles and the addition amount of the mica compound used to make the protective layer coating liquid in Example 1 were changed as shown in Table 1.

Example 6

A recording layer was formed using the same recording layer coating liquid [P-1] as Example 1, thereafter the following protective layer coating liquid [2] was applied to the surface of the recording layer with a wire bar, and the resultant coating was dried for 75 seconds at 125° C. in a hot air drier to form a first protective layer.

The total coating amount (dry coating amount) of the protective layer was 0.5 g/m².

| <Protective layer coating liquid [2]> | |
|---|---|
| Synthetic mica (SOMASIF ME-100 manufactured by Co-op Chemical Co., Ltd., 8% aqueous dispersion) | 94 g |
| Polyvinyl alcohol (CKS-50: saponification degree of 99 mol %, degree of polymerization of 300, manufactured by Nippon Synthetic Chemical Industry Co., Ltd.) | 82 g |
| Surfactant-1 (PLURONIC P-84, manufactured by BASF) | 2.5 g |
| Surfactant-2 (EMALEX 710, manufactured by Nihon-Emulsion Co., Ltd.) | 5 g |
| Pure water | 1384 g |

Subsequently, the following protective layer coating liquid [3] was applied to the surface of the first protective layer with a wire bar, and the resultant coating was dried for 60 seconds at 125° C. in a hot air drier to form a second protective layer. Thus, a planographic printing plate precursor of Example 6 was obtained.

The total coating amount (dry coating amount) of the second protective layer was 1.2 g/m².

| <Protective layer coating liquid [3]> | |
|---|---|
| Polyvinyl alcohol (CKS-50: saponification degree of 99 mol %, degree of polymerization of 300, manufactured by Nippon Synthetic Chemical Industry Co., Ltd.) | 58 g |
| CELLOGEN PR manufactured by Dai-ichi Kogyo Seiyaku Co., Ltd. | 24 g |
| Surfactant-1 (EMALEX 710, manufactured by Nihon-Emulsion Co., Ltd.) | 5 g |
| Aqueous dispersion of silica composite organic resin fine particles (aqueous dispersion of OPTBEADS 6500M) | 20 g |
| Pure water | 1384 g |

Example 7

A recording layer was formed using the same recording layer coating liquid [P-1] as Example 1, thereafter the following protective layer coating liquid [4] was applied to the surface of the recording layer with a wire bar, and the resultant coating was dried for 75 seconds at 125° C. in a hot air drier to form a first protective layer.

The total coating amount (dry coating amount) of the protective layer was 0.5 g/m².

| <Protective layer coating liquid [4]> | |
|---|---|
| Synthetic mica (SOMASIF ME-100 manufactured by Co-op Chemical Co., Ltd., 8% aqueous dispersion) | 94 g |
| Polyvinyl alcohol (CKS-50: saponification degree of 99 mol %, degree of polymerization of 300, manufactured by Nippon Synthetic Chemical Industry Co., Ltd.) | 82 g |
| Surfactant-1 (PLURONIC P-84, manufactured by BASF) | 2.5 g |
| Surfactant-2 (EMALEX 710, manufactured by Nihon-Emulsion Co., Ltd.) | 5 g |
| Pure water | 1384 g |

Subsequently, the following protective layer coating liquid [5] was applied to the surface of the first protective layer with a wire bar, and the resultant coating was dried for 60 seconds at 125° C. in a hot air drier to form a second protective layer. Thus, a planographic printing plate precursor of Example 7 was obtained.

The total coating amount (dry coating amount) of the second protective layer was 1.2 g/m².

| <Protective layer coating liquid [5]> | |
|---|---|
| Polyvinyl alcohol (CKS-50: saponification degree of 99 mol %, degree of polymerization of 300, manufactured by Nippon Synthetic Chemical Industry Co., Ltd.) | 58 g |
| CELLOGEN PR manufactured by Dai-ichi Kogyo Seiyaku Co., Ltd. | 24 g |
| Surfactant-1 (EMALEX 710, manufactured by Nihon-Emulsion Co., Ltd.) | 5 g |
| Aqueous dispersion of silica composite organic resin fine particles (aqueous dispersion of ARTPEARL J-7P) | 20 g |
| Pure water | 2793 g |

Example 8

A planographic printing plate precursor of Example 8 was obtained in the same manner as in Example 1, except that the following back coat layer coating liquid [1] was applied to the rear surface of the support of Example 1 with a wire bar, and the resultant coating was dried for 60 seconds at 125° C. in a hot air drier to form a back coat layer composed of an organic resin.

The total coating amount (dry coating amount) of the back coat layer was 0.5 g/m².

| <Back coat layer coating liquid [1]> | |
|---|---|
| PR55422 (manufactured by Sumitomo Bakelite Co., Ltd.) (phenol/m-cresol/p-cresol = 5/3/2, average molecular weight 5300) | 1.0 g |
| Fluorinated surfactant (F780F, manufactured by Dainippon Ink And Chemicals, Incorporated) | 0.005 g |
| Methyl ethyl ketone | 25 g |

Comparative Example 1

A planographic printing plate precursor of Comparative Example 1 was obtained in the same manner as in Example 1, except that the silica composite organic resin fine particles and synthetic mica were omitted from the ingredients of the protective layer coating liquid of Example 1.

Comparative Example 2

A planographic printing plate precursor of Comparative Example 2 was obtained in the same manner as in Example 6, except that the silica composite organic resin fine particles were omitted from the ingredients of the protective layer coating liquid for the uppermost layer of Example 1.

[Evaluation of Planographic Printing Plate Precursors]

(1) Evaluation of Sensitivity

Each of the planographic printing plate precursors obtained as described above was subjected to exposure using Trendsetter 800II Quantum (manufactured by Creo Products, Inc.) with an output power changed from 0 W to 8 W in increments of log E=0.15 at a resolution of 2400 dpi at an external drum rotation speed of 200 rpm. The exposure was conducted under conditions of 25° C. and 50% RH.

Each of the exposed planographic printing plate precursors was, without passing through heating treatment and water washing treatment, subjected to development treatment using an automatic developing machine LP-1310HII manufactured by Fuji Film Corporation at a conveyance speed (line speed) of 2 m/minute and a development temperature of 30° C. The developing solution was a 1:4 water-diluted solution of DH-N, the replenishing development solution was a 1:1.4 water-diluted solution of FCT-421, and the finisher was a 1:1 water-diluted solution of GN-2K manufactured by Fuji Film Corporation.

The cyan density in the image portion of the planographic printing plate obtained after development was measured using Macbeth reflection densitometer RD-918 equipped with a red filter. The reciprocal of the amount of light exposure required to achieve a density of 0.9 was recorded as the index of the sensitivity.

The sensitivity of the planographic printing plate of Example 1 was set at 100, and the sensitivity of other planographic printing plates was relatively evaluated. The higher the value is, the higher the sensitivity is.

(2) Evaluation of Scratch Resistance

Twenty sheets of the obtained planographic printing plate precursor were piled to make a pile without interposing laminating paper. The pile was stacked on the planographic printing plate precursor of the invention which had been set in a cassette, with an outward displacement of 5 cm from the edge (in a condition that the pile of the 20 sheets of the plate materials was outwardly displaced by 5 cm from the edge of the plate material in the cassette), thereafter the edge of the displaced 20 sheets of the plate material was squeezed into the cassette in a horizontal direction in such a manner that the rear surface of the aluminum support at the bottom of the pile of the 20 sheets rubbed the front surface of the protective layer of the top planographic printing plate precursor in the cassette. The plate material having the protective layer whose front surface had been rubbed with the rear surface of the aluminum support was used for evaluating the scratch resistance.

The plate material was transferred from the set position to TRENDERSETTER 3244 (manufactured by Creo Products, Inc.) using an autoloader, and exposed to light at an output power of 7 W at an external drum rotation speed of 150 rpm at a plate surface energy of 110 mJ/cm² to form a 50% halftone tint image having a resolution of 2400 dpi. After the exposure, development treatment was conducted in the same manner as in the evaluation of the sensitivity. The presence or absence of scratches produced on the halftone tint image of the obtained planographic printing plate was evaluated by visual observation.

The evaluation was conducted by sensory evaluation using a scale of 1 to 5, wherein 3 represents a lowest practical level, and 2 or lower represent practically unacceptable levels.

(3) Evaluation of Adhesiveness Between Planographic Printing Plate Precursors 3 sheets of the obtained planographic printing plate precursor (10×10 cm) were left for 2 hours under conditions of 25° C. and 75% RH. Thereafter, the 3 sheets of the precursor were successively piled in the same direction to make a pile without interposing laminated paper. The pile was tightly wrapped with kraft paper having an aluminum laminate layer, and allowed to stand for 5 days at 30° C. while a load of 4 kg was applied thereto. Thereafter, the pile was evaluated for the adhesiveness between the surface of the recording layer side (the front surface of the protective layer) of one planographic printing plate precursor and the surface of the support side of the adjacent planographic printing plate precursor.

The adhesion between the planographic printing plate precursors was evaluated by sensory evaluation using a scale of 1 to 5, wherein 3 represents a lowest practical level, and 2 or lower represent practically unacceptable levels. The results of the above evaluations are shown in Table 1.

TABLE 1

| | Silica-coated fine particles in protective layer | | Evaluation of planographic printing plate precursors | | |
|---|---|---|---|---|---|
| | Silica-coated fine particles | Addition amount (g) | Sensitivity | Scratch resistance | Adhesiveness |
| Example 1 | OPTBEADS 6500M | 15 | 100 | 4 | 5 |
| Example 2 | OPTBEADS 6500M | 20 | 110 | 5 | 5 |
| Example 3 | ARTPEARL J-7P | 15 | 100 | 5 | 5 |
| Example 4 | ARTPEARL J-7P | 20 | 100 | 5 | 5 |
| Example 5 | ARTPEARL U-800T | 15 | 100 | 4 | 4 |
| Example 6 | OPTBEADS 6500M | 15 | 105 | 5 | 5 |
| Example 7 | ARTPEARL J-7P | 20 | 105 | 5 | 5 |
| Example 8 | OPTBEADS 6500M | 15 | 105 | 5 | 5 |
| Comparative Example 1 | — | — | 100 | 2 | 2 |
| Comparative Example 2 | — | — | 100 | 2 | 2 |

As is evident from Table 1, each of the planographic printing plate precursors of Examples 1 to 5, more specifically, planographic printing plate precursors composed of a polymerizable negative-type recording layer having provided thereon a protective layer containing silica-coated fine particles and polyvinyl alcohol exhibits a high sensitivity, excellent scratch resistance without laminated paper, and caused no adhesion between the planographic printing plate precursors even after standing under a high humidity.

In addition, the comparison between Examples 1 and 6 indicates that a planographic printing plate having a laminated structure having a protective layer containing a mica compound and an uppermost protective layer containing silica-coated fine particles shows further improvement in the sensitivity and scratch resistance.

On the other hand, the planographic printing plate precursors of Comparative Examples 1 to 3 having a protective layer containing no silica-coated organic resin fine particles exhibits excellent sensitivity, however they causes adhesion between the planographic printing plate precursors after standing under a high humidity, and shows significantly poor scratch resistance of the front surface of the protective layer when they are rubbed with the rear surface of the aluminum support.

Example 9

Preparation of Aqueous Dispersion of Silica-Coated Fine Particles (MS1)

Preparation of Aqueous Dispersion Containing Acrylate Particles 90 parts by mass of methyl methacrylate, 5 parts by mass of methoxypolyethylene glycol methacrylate (trade name: NK ESTER M-90G, #400 manufactured by Shin-nakamura Chemical Co., Ltd.), 5 parts by mass of 4-vinylpyridine, 1 part by mass of an azo polymerization initiator (trade name: V50 manufactured by Wako Pure Chemical Industries, Ltd.), and 400 parts by mass of deionized water were placed in a flask, and stirred and heated to 70° C. in a nitrogen gas atmosphere. Stirring was continued for 24 hours at the temperature. The reaction mixture was diluted with deionized water to obtain an aqueous dispersion containing 10% by mass of polymethyl methacrylate particles having an average particle diameter of 6 μm and a functional group provided with a positive ion of an amino group and a polyethylene glycol chain. The polymerization yield was 92%. Hundred parts by mass of the aqueous dispersion were placed in a flask, and 1 part by mass of methyltrimethoxysilane was added to the content of the flask, and the resultant mixture was stirred for 2 hours at 40° C. Thereafter, 1 N aqueous nitric acid solution was added to the mixture to adjust the pH of the mixture to 2.0. Thus, an aqueous dispersion containing acrylate particles was obtained.

Preparation of Aqueous Dispersion Containing Colloidal Silica Particles

Colloidal silica particles (trade name: SNOWTEX O manufactured by Nissan Chemical Industries, Ltd., and having an average primary particle diameter of 12 nm) were dispersed in water, and 1 N aqueous potassium hydroxide solution was added to the dispersion to adjust the pH of the dispersion. Thus, an aqueous dispersion containing 10% by mass of colloidal silica particles and having pH of 8.5 was obtained.

Preparation of organic Particles Whose Surface was Coated with Colloidal Silica (MS 1)

To 100 parts by mass of the above-described aqueous dispersion containing organic particles, which was being stirred, 50 parts by mass of the above-described aqueous dispersion containing colloidal silica particles were slowly added over a period of 2 hours. The resultant mixture was stirred for another 2 hours. Thus, an aqueous dispersion containing polymethyl methacrylate particles to which silica particles had adhered was obtained.

Subsequently, to the aqueous dispersion obtained above, 2 parts by mass of vinyltriethoxysilane were added. The resultant dispersion was stirred for 1 hour, and then 1 part by mass of tetraethoxysilane was added thereto. The mixture was heated to 60° C., stirred for 3 hours, and then cooled to room temperature. Thus, an aqueous dispersion containing 10% by mass of organic particles that had an average diameter of 6.5 μm and whose surfaces were coated with colloidal silica (hereinafter referred to MS1) was obtained. Thereafter, stirring was stopped, and the dispersion was allowed to stand for 24 hours to settle the MS1, and the supernatant was removed by decantation. Thereafter, 200 parts by mass of pure water were added to the residue, the resultant mixture was allowed to stand for 24 hours, and then the supernatant was removed by decantation. The MS1 in a half wet state was dried by blowing hot air of 70° C., and 12 parts by mass of a solid were taken out. According to the observation of the MS1 using a scanning electron microscope, it was found that silica particles had adhered to 80% of the surfaces of polymethyl methacrylate particles.

Aqueous Dispersion of Silica-Coated Fine Particles

Ten parts by mass of the above-described MS1 solid were added to 190 parts by mass of a mica dispersion liquid (trade name: MEB-3L manufactured by Co-op Chemical Co., Ltd., and having a mica solid content of 3.2%), and the resultant was dispersed for 15 minutes at 10,000 rpm using Ace Homogenizer (manufactured by Nippon Seiki Co., Ltd.). Thus, an MS1 aqueous dispersion was obtained.

The following protective layer coating liquid [4] was applied with a wire bar to the surface of the recording layer formed with the same recording layer coating liquid [P-1] as that used in Example 1, and the resultant coating was dried for 75 seconds at 125° C. in a hot air drier to form a first protective layer.

The total application amount (dry coating amount) of the protective layer was 0.5 g/m².

| <Protective layer coating liquid [4]> | |
|---|---|
| Synthetic mica (SOMASIF ME-100 manufactured by Co-op Chemical Co., Ltd., 8% aqueous dispersion) | 94 g |
| Polyvinyl alcohol (CKS-50: degree of saponification of 99 mol %, degree of polymerization of 300, manufactured by Nippon Synthetic Chemical Industry Co., Ltd.) | 82 g |
| Surfactant-1 (PLURONIC P-84 manufactured by BASF) | 2.5 g |
| Surfactant-2 (EMALEX 710 manufactured by Nihon-Emulsion Co., Ltd.) | 5 g |
| Pure water | 1384 g |

Subsequently, the following protective layer coating liquid [5] was applied to the surface of the first protective layer with a wire bar, and the resultant coating was dried for 60 seconds at 125° C. in a hot air drier to form a second protective layer. Thus, a planographic printing plate precursor of Example 9 was obtained.

The total application amount (dry coating amount) of the second protective layer was 1.2 g/m².

| <Protective layer coating liquid [5]> | |
|---|---|
| Polyvinyl alcohol (CKS-50: degree of saponification of 99 mol %, degree of polymerization of 300, manufactured by Nippon Synthetic Chemical Industry Co., Ltd.) | 58 g |
| CELLOGEN PR manufactured by Dai-Ichi Kogyo Seiyaku Co., Ltd. | 24 g |
| Surfactant-1 (EMALEX 710 manufactured by Nihon-Emulsion Co., Ltd.) | 5 g |
| Silica composite organic resin fine particles (aqueous dispersion of the above-described MS1) | 20 g |
| Pure water | 2793 g |

The planographic printing plate precursor was evaluated in the same manner as in Example 1 and the results of the evaluations are shown in Table 2.

TABLE 2

| | Silica-coated fine particles in protective layer | | Evaluation of planographic printing plate precursor | | |
|---|---|---|---|---|---|
| | Silica-coated fine particles | Addition amount (g)*1 | Sensitivity | Scratch resistance | Adhesiveness |
| Example 9 | MS1 | 20 | 100 | 5 | 5 |

Note
*1 Addition amount of silica-coated fine particle aqueous dispersion in protective layer

What is claimed is:

1. A negative-type planographic printing plate precursor that is writable by laser exposure, comprising a support, a polymerizable negative-type recording layer writable by infrared laser exposure and provided on the support, and a protective layer containing a hydrophilic polymer and silica-coated organic resin fine particles provided as the uppermost layer, wherein the support is an aluminum support, and the recording layer contains a sensitizing dye, a polymerization initiator, a polymerizable compound, and a binder polymer.

2. The planographic printing plate precursor of claim 1, wherein the hydrophilic polymer is polyvinyl alcohol.

3. The planographic printing plate precursor of claim 1, wherein the organic resin of the organic resin fine particles is at least one resin selected from the group consisting of polyacrylic acid resins, polyurethane resins, polystyrene resins, polyester resins, epoxy resins, phenolic resins, and melamine resins.

4. The planographic printing plate precursor of claim 1, wherein the protective layer has a monolayer structure or a laminated structure having a plurality of layers, and the monolayer or at least one layer of the laminated structure contains a mica compound.

5. The planographic printing plate precursor of claim 1, wherein the support is an aluminum support and has a back coat layer composed of an organic resin on a side at which the recording layer is not provided.

6. A pile of planographic printing plate precursors comprising a plurality of the planographic printing plate precursors of claim 1, wherein the planographic printing plate precursors are piled in direct contact with each other.

7. The planographic printing plate precursor of claim 1, wherein the binder polymer is a polymer having a repeating unit represented by the following Formula (i):

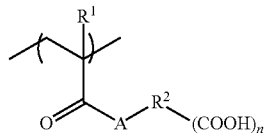

Formula (i)

wherein in Formula (i), $R^1$ represents a hydrogen atom or a methyl group; $R^2$ represents a connecting group which includes two or more atoms selected from the group consisting of a carbon atom, a hydrogen atom, an oxygen atom, a nitrogen atom and a sulfur atom and which has 2 to 82 atoms in total; A represents an oxygen atom or $-NR^3-$; $R^3$ represents a hydrogen atom or a monovalent hydrocarbon group having 1 to 10 carbon atoms; and n represents an integer of 1 to 5.

8. The planographic printing plate precursor of claim 1, wherein the polymerization initiator is represented by the following Formula (1):

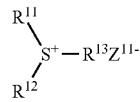

Formula (1)

wherein in Formula (1), $R^{11}$, $R^{12}$ and $R^{13}$ may be the same or different, and each represent a hydrocarbon group having 20 or less carbon atoms which may have at least one substituent; and $Z^{11-}$ represents a counter ion selected from the group consisting of a halogen ion, a perchlorate ion, a tetrafluoroborate ion, a hexafluorophosphate ion, a carboxylate ion, and a sulfonate ion.

9. The planographic printing plate precursor of claim 1, wherein the organic resin of the organic resin fine particles is at least one resin selected from the group consisting of polyacrylic acid resins, polyurethane resins, polystyrene resins, polyester resins, epoxy resins, and phenolic resins.

10. The planographic printing plate precursor of claim 2, wherein the polyvinyl alcohol has a saponification degree of 85 to 99.

* * * * *